US009520251B2

(12) United States Patent
Keane et al.

(10) Patent No.: US 9,520,251 B2
(45) Date of Patent: Dec. 13, 2016

(54) RF SWITCH WITH INTER-DOMAIN ESD PROTECTION

(71) Applicant: FERFICS LIMITED, Little Island, Cork (IE)

(72) Inventors: John Keane, Co. Cork (IE); John O'Sullivan, Cork (IE); Ian O'Regan, Co. Cork (IE)

(73) Assignee: Ferfics Limited (IE)

( * ) Notice: Subject to any disclaimer, the term of this patent is extended or adjusted under 35 U.S.C. 154(b) by 708 days.

(21) Appl. No.: 13/871,630

(22) Filed: Apr. 26, 2013

(65) Prior Publication Data

US 2014/0321008 A1 Oct. 30, 2014

(51) Int. Cl.
*H02H 9/00* (2006.01)
*H01H 11/00* (2006.01)
*H03K 17/693* (2006.01)

(52) U.S. Cl.
CPC ............ *H01H 11/00* (2013.01); *H03K 17/693* (2013.01); *Y10T 29/41* (2015.01)

(58) Field of Classification Search
USPC ............................................................ 361/56
See application file for complete search history.

(56) References Cited

U.S. PATENT DOCUMENTS

| | | | | |
|---|---|---|---|---|
| 9,048,787 B2 * | 6/2015 | Jones | H03F 1/0227 | |
| 2005/0152081 A1 * | 7/2005 | Worley | H01L 27/0292 | 361/56 |
| 2010/0002345 A1 * | 1/2010 | Young | H01L 27/0255 | 361/56 |
| 2013/0147445 A1 * | 6/2013 | Levesque | G05F 1/595 | 323/271 |
| 2013/0155556 A1 * | 6/2013 | Tsai | H01L 27/0251 | 361/56 |
| 2013/0271224 A1 * | 10/2013 | Puliafico | H03F 3/19 | 330/296 |

* cited by examiner

*Primary Examiner* — Ronald W Leja
(74) *Attorney, Agent, or Firm* — Tarolli, Sundheim, Covell & Tummino LLP

(57) ABSTRACT

An RF switch with inter-domain ESD protection. The RF switch comprises an RF domain section having a plurality of RF switching elements; and a DC domain section having circuitry configured for driving the RF switching elements. At least one primary ESD protection element is operably coupled between the RF domain section and DC domain section.

27 Claims, 13 Drawing Sheets

Prior Art vss = -2.5V

RF SWITCH WITH INTER-DOMAIN ESD PROTECTION

FIELD OF THE INVENTION

The present teaching relates to an RF switch circuit with inter-domain ESD protection. In particular, the present teaching relates to an RF switch circuit which includes ESD protection between a DC domain section and an RF domain section.

BACKGROUND

The act of switching radio frequency signals in an integrated circuit is carried out by an RF switch circuit. RF switches are well known in the art and provide a key building block in wireless systems. RF switches may be utilised in numerous applications such as mobile phones and wireless Local Area Networks (LANs). Such switches may include any number of switching elements which cooperate to control the flow of RF power between various circuit nodes. Performance metrics such as low insertion loss, high linearity, high isolation and power handling are critical in RF switch design.

Generally an RF switch does not consist of the RF switching circuit alone. Typically RF switch system is comprised of two domains; an RF domain which includes the switching elements and a DC domain which includes control logic, bias generation and power management circuitry. When the switch is operational, a high degree of isolation must be maintained between the RF and DC domains. Inadequate isolation between domains will compromise performance of the system resulting in reduced linearity, reduced power handling capability, reliability and operating lifetime may also be reduced.

Electrostatic discharge, (ESD), events can occur at any stage in the processing or handling of integrated circuits (ICs). The robustness of an IC to ESD is an important consideration that is determined by its capability to safely discharge a high current pulse generated during an ESD event without developing excessive voltage levels or heating that can cause damage to devices on the IC. There are various models to reproduce ESD events to which the IC may be subjected, for example, the Human Body Model (HBM) and Machine Model (MM). Both model an ESD event where discharge occurs between any two pins of an IC. Industry standard targets for IC ESD robustness are typically 1-2 kV for HBM and 100-200V for MM.

In the case of an RF switch, occurrence of an ESD event between a pin in the RF domain and a pin in the DC domain is particularly challenging. There is a conflict between the requirement to provide a low impedance path between the RF and DC domains in order to discharge current during an ESD event, and the requirement to maintain a high level of isolation between the RF and DC domains during normal operation.

The traditional approach to address this conflict has been to prioritise RF performance at the expense of ESD robustness by maintaining isolation between the RF and DC domains at die level. This approach originated from the historical arrangement where RF and DC sections were not integrated on the same semiconductor die. The RF domain was often a GaAs integrated circuit (IC) containing RF switch transistor elements, while the DC domain included a separate CMOS controller IC. As CMOS RF switches became more common, with RF and DC domains integrated on the same die, the existing approach for providing ESD protection at die level was maintained despite it being susceptible to inter-domain ESD events. In the traditional approach inter-domain ESD robustness of 1-2 kV is typically achieved when an external conduction path is provided between the RF and DC pins when both domains are connected to a common ground. Prior to providing the external conduction path ESD robustness of the die to a HBM event is typically limited to less than 100V. Dies with lower ESD robustness levels are more susceptible to yield fallout during packaging, test and handling and may also incur higher levels of product failures in field. Tighter ESD controls are required in facilities processing dies with low levels of ESD robustness, restricting the choice of location where these devices may be safely handled and processed.

There is therefore a need to provide an RF switch which addresses at least some of the drawbacks of the prior art.

SUMMARY

These and other problems are addressed by providing an RF switch having ESD protection provided between a DC domain section and an RF domain section.

In one embodiment there is provided an RF switch which comprises an RF domain section having a plurality of RF switching elements; a DC domain section having circuitry configured for driving the RF switching elements; and at least one primary ESD protection element operably coupled between the RF domain section and DC domain section.

In an exemplary arrangement, the at least one primary ESD protection element is provided on a semiconductor substrate containing the RF domain section and the DC domain section. Preferably, the at least one primary ESD protection element is operably coupled between a supply voltage node in the DC domain section and an RF ground reference node in the RF domain section. In another embodiment, the RF domain section includes one or more RF ground reference nodes each associated with a corresponding transistor connecting two RF nodes.

In one embodiment, the DC domain section comprises one or more secondary ESD protection elements. Advantageously, the DC domain section comprises two secondary ESD protection elements. Preferably, one of the secondary ESD protection elements is operably coupled to an output node of a voltage regulator in the DC domain section. Ideally, the other one of the secondary ESD protection elements is operably coupled to an output node of a negative voltage generator in the DC domain section.

In an additional aspect, a plurality of RF isolation filters are operably coupled between the DC domain section and the RF domain section, the respective RF isolation filters include resistive loads which are scaled relatively to an effective resistive load that occurs between an output node of the RF isolation filter and a terminal of an RF switch element in the RF domain section. Advantageously, the RF switch element comprises one or more transistors. Preferably, the effective resistive load occurs between the output node of the RF isolation filter and a gate or body terminal of the transistor.

In a further aspect, at least one RF isolation filter comprises an ESD protection element operably coupled between the DC domain section and the RF domain section. Advantageously, the at least one RF isolation filter comprises a pair of capacitors and a resistor operably coupled there between, one of the capacitors is associated with the DC domain section and the other capacitor is associated with the RF domain section, the ESD protection element is operably coupled to the resistor.

In another arrangement, one or more transistor stacks are provided in the RF domain section. Ideally, the RF domain section comprises a stack of first transistors and a stack of second transistors. A clamping element may be associated with each transistor. Advantageously, the clamping element is operably coupled between a body terminal and a gate terminal of the corresponding transistor. Preferably, the clamping element comprises a transistor. Ideally, the clamping element comprises a MOSFET transistor. Advantageously, the clamping element is turned off during normal operation of the RF switch and is turned on in response to experiencing an ESD event.

In one aspect a silicon-on-insulator structure is provided having an RF switch circuit fabricated thereon, wherein the RF switch circuit comprises an RF domain section having a plurality of RF switching elements; a DC domain section having circuitry configured for driving the RF switching elements; and at least one primary ESD element operably coupled between the RF domain section and DC domain section.

In a further aspect, a method of fabricating an RF switch circuit is described; the method comprises: providing an RF domain section having a plurality of RF switching elements on a semiconductor substrate; providing a DC domain section having circuitry configured for driving the RF switching elements on the semiconductor substrate; and providing at least one primary ESD protection element operably coupled between the RF domain section and DC domain section on the semiconductor substrate. Advantageously, the at least one primary ESD protection element is operably coupled between a supply voltage node in the DC domain section and an RF ground reference node in the RF domain section. Ideally, the method includes providing one or more secondary ESD protection elements in the DC domain section. In a further aspect the method includes coupling one of the secondary ESD protection elements to an output node of a voltage regulator in the DC domain section. Additionally, the method includes coupling the other one of the secondary ESD protection elements to an output node of a negative voltage generator in the DC domain section. Preferably, the method further includes providing at least one RF isolation filter having an ESD protection element on the semiconductor substrate between the DC domain section and the RF domain section. Ideally, the at least one RF isolation filter comprises a pair of capacitors and a resistor operably coupled there between, one of the capacitors is associated with the DC domain section and the other capacitor is associated with the RF domain section, the ESD protection element is operably coupled to the resistor. Advantageously, the method further includes providing a stack of first transistors and a stack of second transistors in the RF domain section, and providing respective clamping elements on the semiconductor substrate which are associated with corresponding transistors. Advantageously, the method includes coupling the respective clamping elements between a body terminal and a gate terminal of the corresponding transistor. Ideally, the clamping elements comprise a Mosfet transistor.

These and other features will be better understood with reference to the followings Figures which are provided to assist in an understanding of the present teaching.

BRIEF DESCRIPTION OF THE DRAWINGS

The present teaching will now be described with reference to the accompanying drawings in which.

DETAILED DESCRIPTION OF THE DRAWINGS

The present teaching will now be described with reference to some exemplary RF switches. It will be understood that the exemplary RF switches are provided to assist in an understanding of the present teaching and are not to be construed as limiting in any fashion. Furthermore, circuit elements or components that are described with reference to any one Figure may be interchanged with those of other Figures or other equivalent circuit elements without departing from the spirit of the present teaching.

Figure 1:
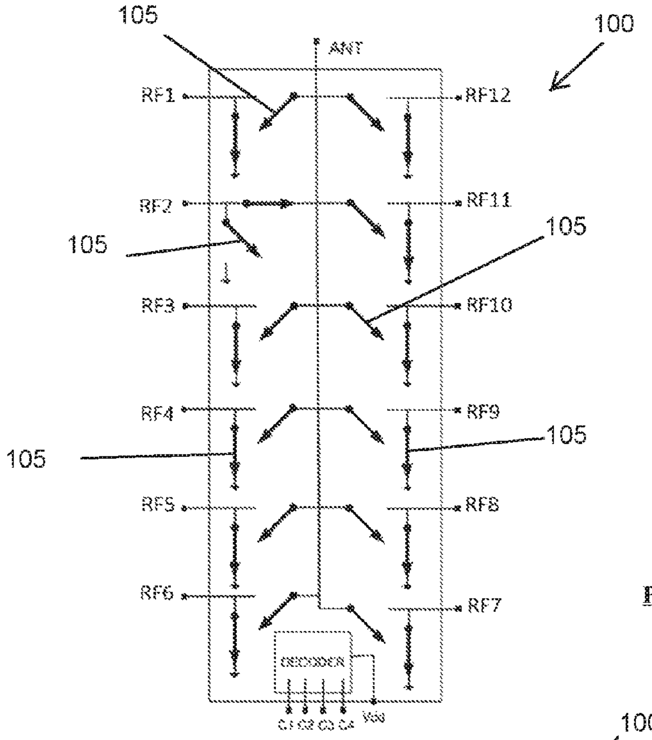
FIG. 1 is a circuit diagram of an exemplary RF switch.
Figure 2:
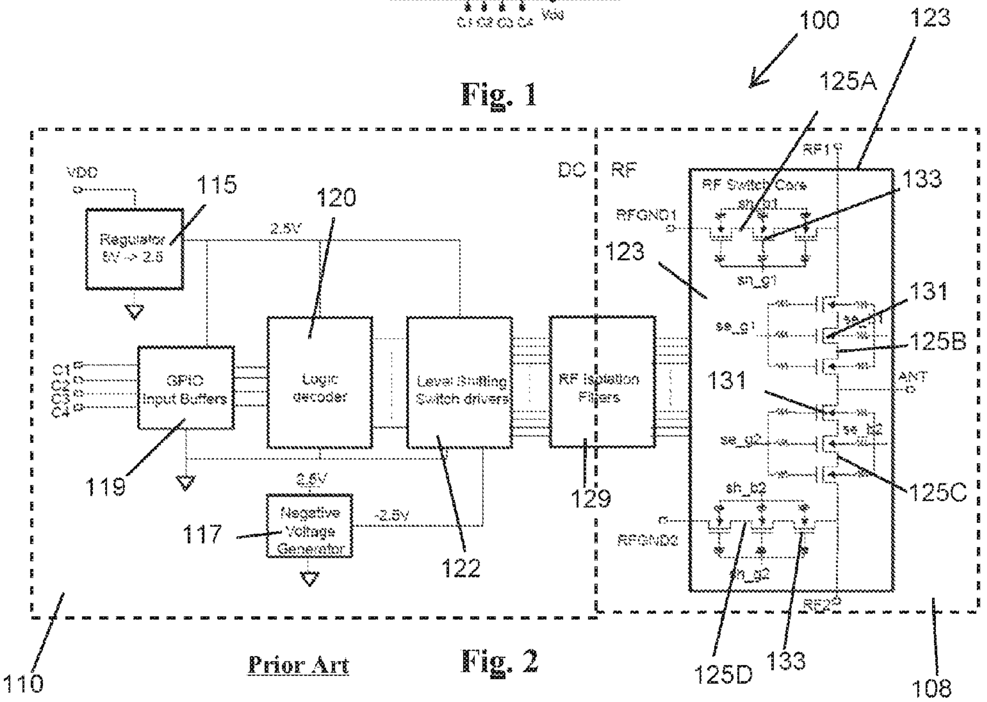
FIG. 2 is a block diagram of an exemplary RF switch.

In advance of describing an RF switch in accordance with the present teaching an exemplary RF switch 100 is first described with reference to FIGS. 1 to 8. The circuit elements described with reference to the RF switch 100 provide the basic circuit blocks of a traditional RF switch. The RF switch 100 comprises a plurality of switching elements 105 which are operably configured to control the flow of RF power between circuit nodes. The RF switch 100 includes two domains; namely, an RF domain section 108 and a DC domain section 110 as illustrated in FIG. 2. The DC domain section 110 may comprise one or more digital logic, bias generation, filter, memory, interface, driver and power management circuitry. The DC domain consists of 5V to 2.5V regulator 115, a negative voltage generator 117, input buffers 119, logic decoder 120 and level-shifting switch drivers 122. These circuits are operably configured to generate the required bias levels, provide power management support and control selection of active switch path through which RF power flows depending on the values set on the control pins C1-C4. Such RF switches are well known in the art.

Figure 3:
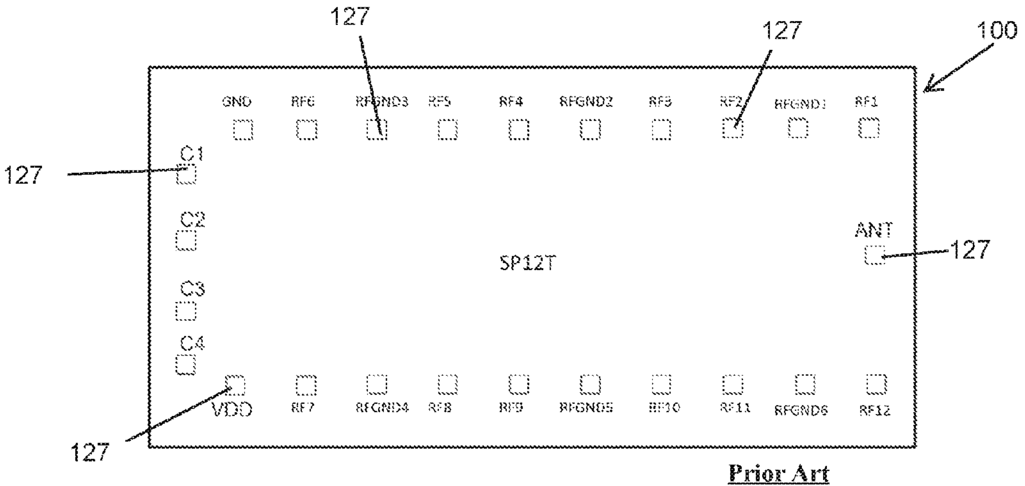
FIG. 3 is pin out diagram of an exemplary RF switch.

The RF domain section 108 comprises a switch core 123 which in the exemplary arrangement includes two series-shunt switch elements 125A-125D. A plurality of transistors 131, 133 are stacked in the switch elements 125A-125D to divide the RF voltage evenly across the transistors so that the voltage between any two terminals of the individual transistors during operation do not exceed a level that may cause performance degradation or damage to the device. RF isolation filters 129 are placed on signal lines controlling the switch gate and body terminals of the transistors 131,133 at the boundary between the RF domain section 108 and the DC domain section 110. In the exemplary arrangement, the RF switch 100 is provided as single-pole, twelve throw (SP12T) RF switch having input/out pins 127 as illustrated in FIG. 3. A description of the pins 127 is detailed in table 1 below.

TABLE 1

| Pin Name | Description |
|---|---|
| RF1 | RF Port |
| RFGND1 | RF Ground reference for shunt transistor connecting to RF1 & RF2 Ports |
| RF2 | RF Port |
| RF3 | RF Port |
| RFGND2 | RF Ground reference for shunt transistor connecting to RF3 & RF4 Ports |
| RF4 | RF Port |
| RF5 | RF Port |
| RFGND3 | RF Ground reference for shunt transistor connecting to RF5 & RF6 |
| RF6 | RF Port |
| GND | Ground reference tor DC domain |
| C1 | Control input, C1-C4 decoded to select which of RF1-RF12 to ANT paths is active |
| C2 | Control input, C1-C4 decoded to select which of RF1-RF12 to ANT paths is active |
| C3 | Control input, C1-C4 decoded to select which of RF1-RF12 to ANT paths is active |
| C4 | Control input, C1-C4 decoded to select which of RF1-RF12 to ANT paths is active |
| VDD | Supply Voltage for DC domain |
| RF7 | RF Port |
| RFGND4 | RF Ground reference for shunt transistor connecting to RF7 & RF8 |
| RF8 | RF Port |
| RF9 | RF Port |
| RFGND5 | RF Ground reference for shunt transistor connecting to RF9 & RF10 |
| RF10 | RF Port |

TABLE 1-continued

| Pin Name | Description |
|---|---|
| RF11 | RF Port |
| RFGND6 | RF Ground reference for shunt transistor connecting to RF11 & RF12 |
| RF12 | RF Port |
| ANT | Antenna Port, RF Common Port |

Figure 4:
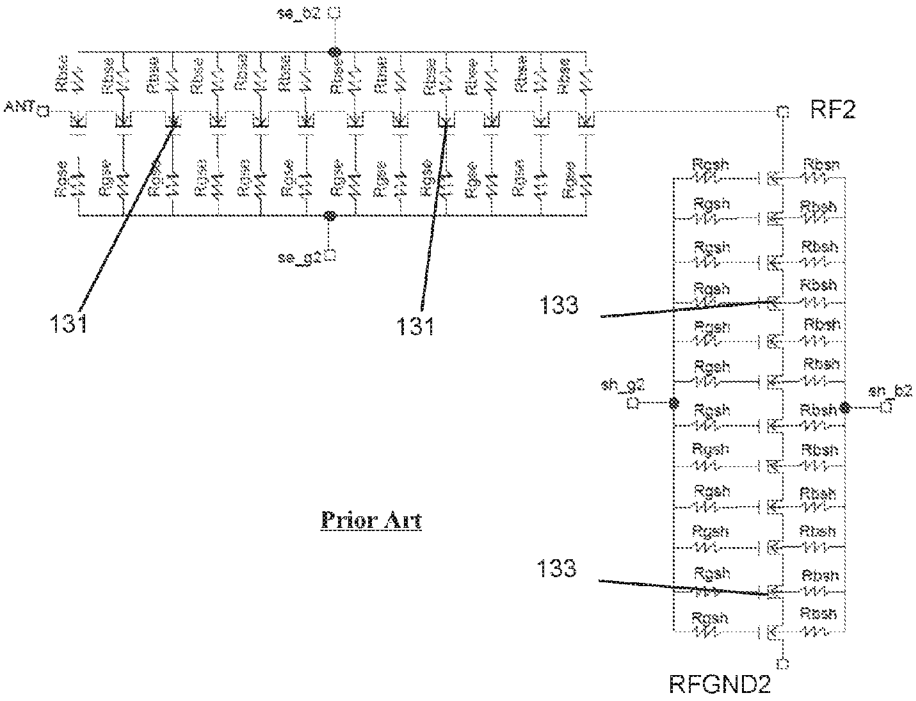
FIG. 4 is a schematic circuit diagram of a detail of the RF switch of FIG. 2.

FIG. 4 shows more detail of the switch core 123 of FIG. 2. The switch core 123 includes a plurality of series transistor elements 131 and a plurality of shunt transistor elements 133. The series transistor elements 131 are in a stacked configuration operably coupled between the antenna node ANT and the RF2 node. The shunt transistor elements 133 are in a stacked configuration operably coupled between the RF2 node and RFGND2 node. The number of transistors in a stack is determined by the maximum RF voltage level that can be experienced on the RF nodes when the switch is operational. The number of transistors in the stack is also important during an ESD event because it influences the total voltage build up. A stack of 10-13 transistor devices is common for maximum RF voltages that can be experienced at GSM transmit power levels.

Figure 5:
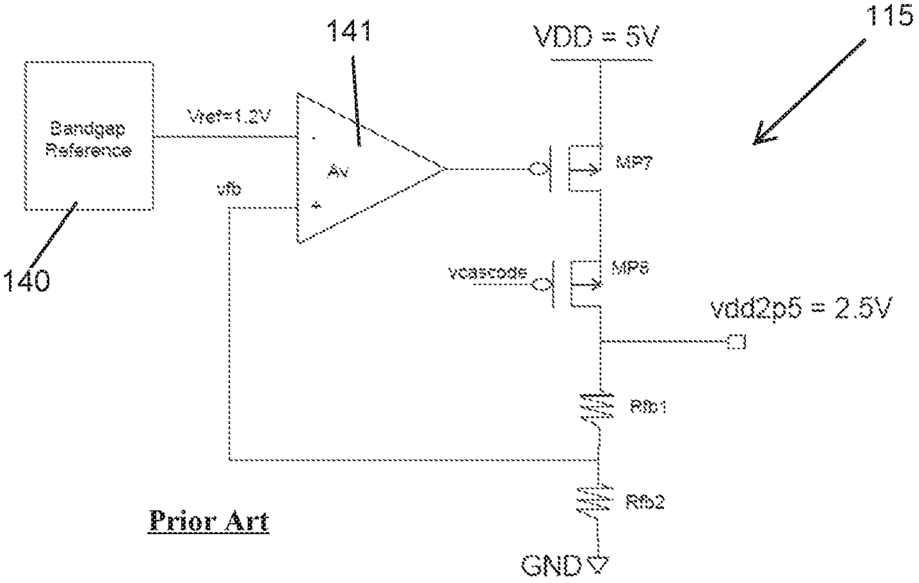
FIG. 5 is a schematic circuit diagram of a detail of the RF switch of FIG. 2.

The voltage regulator 115 of the switch 100 is illustrated in more detail in FIG. 5. The voltage regulator 115 comprises a bandgap reference 140 operably coupled to an input terminal of an op-amp 141. A pair of Mosfet transistors MP7, MP8 and a pair of resistors Rfb1, Rfb2 are stacked between a VDD node and a ground reference node. The output from the op-amp 141 drives the MP7 transistor. The gate of the MP8 transistor is operably coupled to a reference voltage source vcascode. A feedback loop is provided from a node intermediate Rfb1 and Rfb2 and an input terminal to the op-amp 141. The voltage regulator 115 is configured to provide a 2.5V voltage level at a node Vdd2_p_5. In the exemplary arrange the voltage at node vdd2_p_5 is +2.5V.

Figure 6:
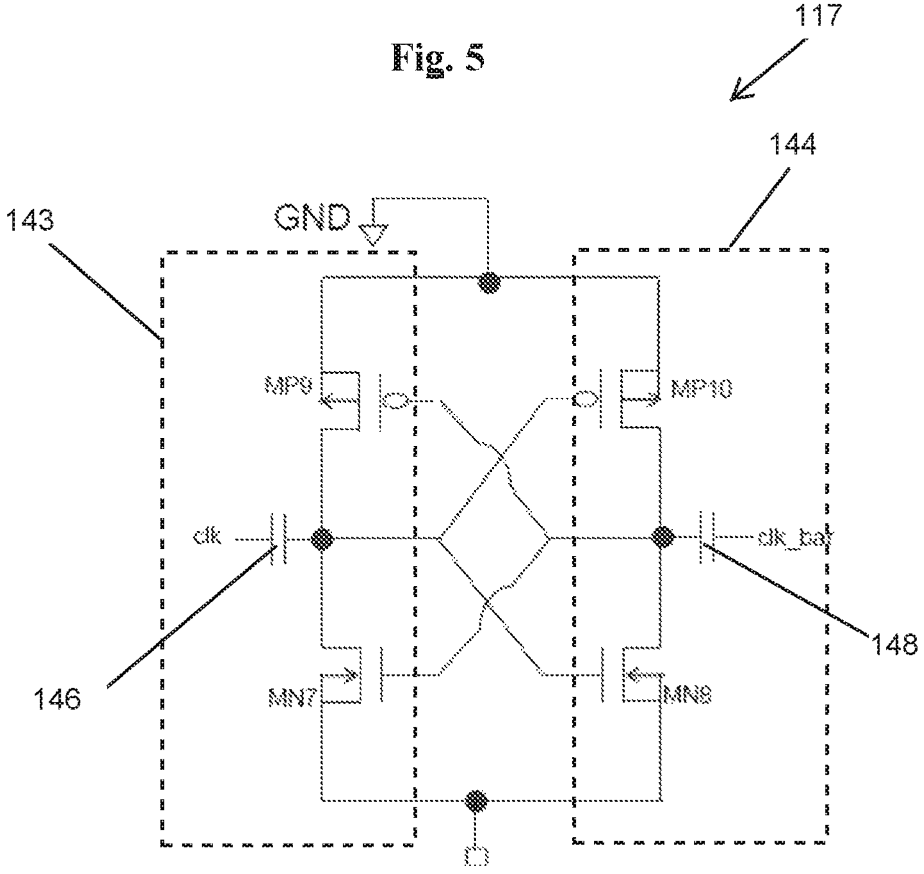
FIG. 6 is a schematic circuit diagram of a detail of the RF switch of FIG. 2.

The negative voltage generator 117 of the switch 100 is illustrated in more detail in FIG. 6. The negative voltage generator 117 comprises a first segment 143 and a second segment 144. The first and second segments 143, 144 are operably coupled between a ground reference node GND and a vss node. The first segment 143 comprises a PMOS transistor MP9 stacked on an NMOS transistor MN7. A first capacitor 146 which receives a clock signal clk is coupled intermediate MP9 and MN7. The second segment 144 comprises a PMOS transistor MP10 stacked on an NMOS transistor MN8. A second capacitor 148 which receives an inverse clock signal clk_bar is coupled intermediate MP10 and MN8. The gates of MP9 and MN7 are driven by the inverse clock signal clk_bar. The gates of MP10 and MN8 are driven by the clock signal clk. The negative voltage generator 117 is configured to provide a negative voltage at node vss. In the exemplary arrangement the negative voltage which is provided at node vss is −2.5V.

Figure 7:
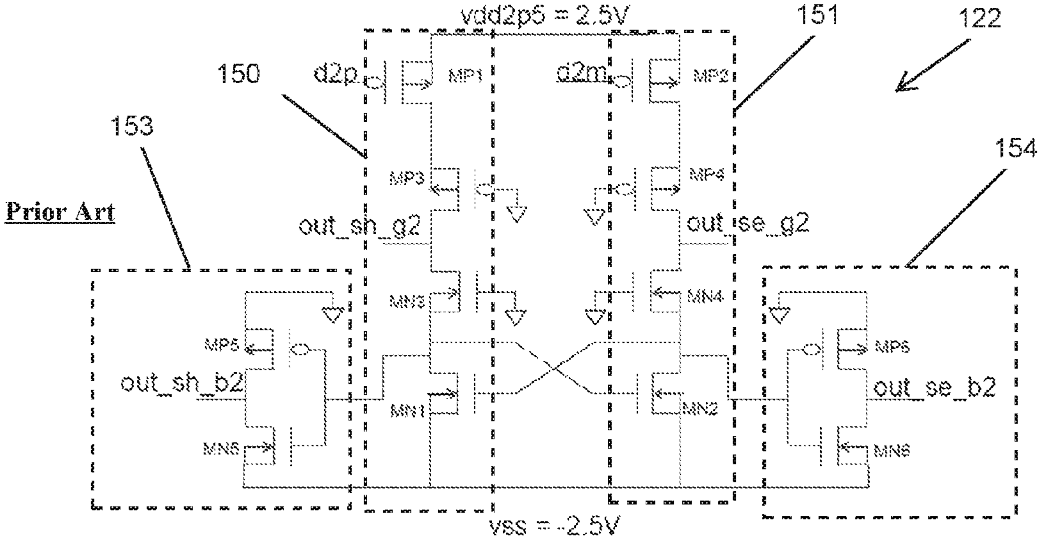
FIG. 7 is a schematic circuit diagram of a detail of the RF switch of FIG. 2.

The level shifting switch drivers 122 of the switch 100 is illustrated in more detail in FIG. 7. The switch driver 122 comprises a first switch segment 150 and a second switch segment 151, which are operably coupled between the vdd2_p_5 node of the 5V-2.5V regulator 115 and the negative voltage node vss of the negative voltage generator 117. In the exemplary arrangement, the first switch segment 150 comprises a pair of PMOS transistors MP1 and MP3 and a pair of NMOS transistors MN3 and MN1. The second switch segment 151 comprises a pair of PMOS transistors MP2 and MP4 and a pair of NMOS transistors MN4 and MN2. The first switch segment 150 is associated with a first CMOS inverter 153 that includes a PMOS transistor MP5 and an NMOS transistor MN5 operably coupled between the vss node and a ground node. The second switch segment 151 is associated with a second CMOS inverter 154 that includes a PMOS transistor MP6 and an NMOS transistor MN6 operably coupled between the vss node and a ground node. The level shifting switch drivers 122 is configured to provide four output drive signals which are outputted at nodes out_sh_g2, out_sh_b2, out_se_g2 and out_se_b2. These drive signals are then filtered by the RF isolation filters 129 and the filtered versions of the signals are used to drive the series-shunt switch elements 125 in the switch core 123 of the RF section 108.

Figure 8:
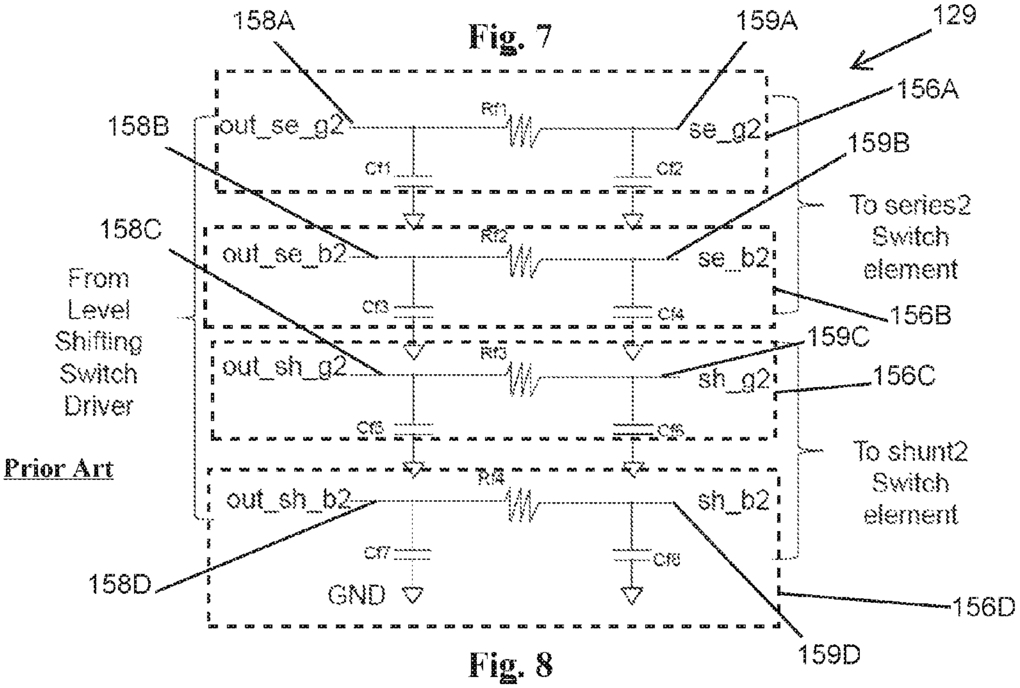
FIG. 8 is a schematic circuit diagram of a detail of the RF switch of FIG. 2.

The RF isolation filters 129 of the switch 100 is illustrated in more detail in FIG. 8. The RF isolation filters 129 are provided in an interface section operably between the DC domain section 110 and the RF domain section 108. In the exemplary arrangement, the filter 129 includes four filter segments 156A-156D. For brevity, only the filter segment 156A is described. However, it will be appreciated by those of ordinary skill in the art that each of the filter segments 156B to 156D operates in a similar fashion to the filter segment 156A. The filter segment 156A includes a pair of capacitors cf1 and cf2 with a resistor Rf1 operably coupled there between. An input node 158A and an output node 159A are provided at respective opposite ends of the resistor Rf1. The capacitors Cf1 and Cf2 each have a first terminal coupled to a ground node. The second terminal of the capacitor Cf1 is coupled to the input node 158A, and the second terminal of the capacitor Cf2 is coupled the output node 159A. The input node 158A receives a drive signal from the node out_se_g2 of the level shifting switch drivers 122 and the output node 159 provides a filtered signal from node se_g2 which drives the gate terminals of the series switch element 125C in the RF switch core 123 of FIG. 2. Thus the signal from node se_g2 is a filtered representation of the signal from node out_se_g2. In the exemplary arrangement, the filter segment 156B outputs a filtered signal from the node se_b2 which is derived from the signal from node out_be_2. The filtered signal from the node se_b2 is used to drive the body terminals of the series switch element 125C in the RF switch core 123. The filter segment 156C outputs a filtered signal from node sh_g2 that is derived from the signal of node out_sh_g2. The filtered signal from the node sh_g2 drives the gate terminals of the shunt switch element 125D in the RF switch core 123. The filter segment 156D outputs a filtered signal from the node sh_b2 which is derived from the signal of node out_sh_b2. The filtered signal from the node sh_b2b drives the body terminals of the shunt switch element 125D in the RF switch core 123.

Figure 9:
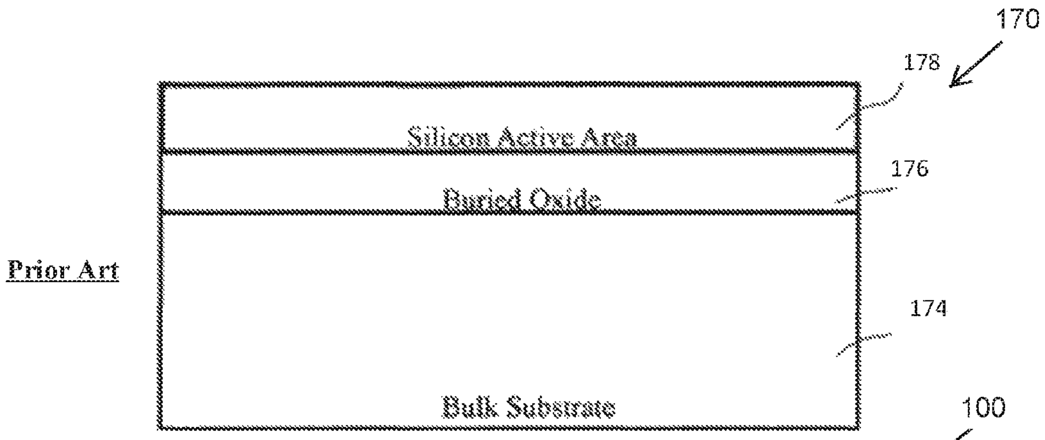
FIG. 9 is a cross sectional view of a silicon-on-insulator structure on which the RF switch is fabricated thereon.

Referring now to FIG. 9 which illustrates a typical silicon-on-insulator (SOI) structure 170 on which the RF switch 100 may be fabricated thereon. In the exemplary arrangement, an insulating layer sits on top of a silicon substrate. A typical material for the insulating layer is silicon dioxide. In general SOI technologies consist of a bulk substrate 174, a buried oxide layer 176 and a thin active silicon layer 178. The bulk substrate 174 is generally a high resistivity substrate. The bulk substrate 174 can be either P-type or N-Type. A typical thickness for the bulk substrate is 250 μm. The buried oxide layer 176 is an insulator layer, typically silicon dioxide. A typical thickness of the buried oxide layer 176 is 1 μm. The active silicon layer 178 above the buried oxide layer 176 is typically of the order of 0.2 μm. The RF switch 100 may be fabricated in the silicon active area 178 using semiconductor processing techniques that are well known in the art and may include for example, but not limited to, deposition, implantation, diffusion, patterning, doping, and etching. The RF domain section 108 and the DC domain section 110 of the RF switch 100 are typically fabricated on a single semiconductor structure.

In non-RF multi-domain ICs, inter-domain ESD protection is generally achieved by placing bidirectional clamp elements between all independent ground nodes. Bidirectional clamp elements are usually back to back diodes. This approach is unsuitable for RF switches because of the high power levels involved and high isolation and linearity requirements. The combination of high power levels and linearity makes the positioning of single diodes on ground pins unsuitable because there is significant RF voltage developed on ground pins due to finite non-zero impedance in the presence of large RF voltage excursions on RF nodes. This RF voltage on ground results in current flowing in diodes that varies over the RF cycle resulting in the generation of unwanted harmonics and distortion. Diodes would have to be stacked to high degree to avoid the current flow due to the RF voltage on the ground pins which impacts linearity and is area prohibitive. Isolation requirement also means that even if stacked elements were feasible traces would have to be routed between all the ground pins on the IC to connect to these elements. This is not practical because of the additional routing required which would introduce additional coupling between the RF nodes and between the RF and DC domains.

Figure 10:
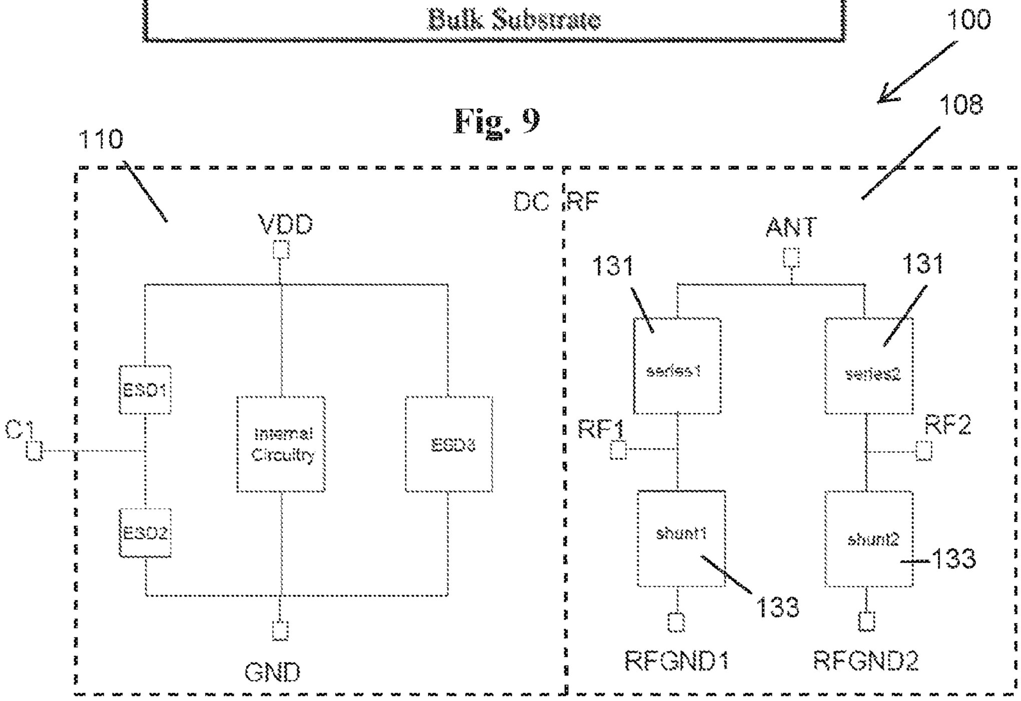
FIG. 10 is a block diagram showing ESD protection in an exemplary RF switch.

Referring now to FIG. 10 which illustrates the traditional approach utilising primary ESD protection architecture on the SP2T RF-switch 100. Included on the diagram are discharge paths for high energy currents during an ESD event. During an ESD event it is desirable to provide a low impedance path through the primary ESD protection that is a more favourable path for the high energy current than flowing through internal circuitry. The series transistor elements 131 and the shunt transistor elements 133 are self-protecting during an ESD event. This means that the main current discharge path from the RF pin is through the series transistor elements 131 or the shunt transistor elements 133. Self-protection may be achieved if the total width of the transistors 131, 133 are sufficiently large to conduct the ESD event current. The transistors which make up the RF switch elements are required to deal with large voltage and current levels with low loss during normal operation. As a result the transistors are sized sufficiently large to also act as ESD protection.

In the DC domain section 110 there are ESD protection devices from control pins to supply, (ESD1) and from control pins to ground, (ESD2). There is also an ESD protection device from supply to ground, (ESD3). Typically ESD protection devices on input control pins, ESD1 and ESD2, are diodes that conduct when the device becomes forward biased. Bi-directional protection is used between the supply and ground pins, ESD3, this usually consists of a unidirectional power clamp in parallel with a diode. Typical peak current level for 2 kV HBM event is 1.3 A. If this level of current is forced through the internal circuitry then damage may occur. From FIG. 10 it can be seen that there is a primary path for the ESD current from all pins in DC domain section 110 to all the other pins in DC domain section 110 and from every pin in the RF domain section 108 to all other pins in the RF domain section 108. For example, in the DC domain section 110, ESD event between C1 and GND is discharged either directly through the ESD2 device or via VDD through ESD1 and ESD3 depending on polarity of event. In the RF domain section 108 there is a discharge path through a series switch element 125 or a shunt switch element for all pin combinations within the RF domain section 108. For example, in the worst case scenario, the longest, path is for an ESD event between the RFGND1 and RFGND2 pins in which case current is discharged through shunt1, series1 , series2 and shunt2 devices. In the traditional approach there is a current discharge path through the primary protection between all the pins within their own domain but there is no discharge path through primary protection for an ESD event that occurs between inter-domain pins, for example, RFGND2 and GND. There is no current discharge path through the primary protection devices for RFGND2 to GND if an ESD event occurs. There is finite isolation between the RF and DC domains sections 108, 110 via the switch gate and body terminals through the RF isolation filters 129 and the switch drivers 122. In this case, current will be forced to flow through this path and circuitry in the DC domain section 110 which provides clamping to GND. The peak ESD voltage is limited to much less than the 1-2 kV industry standard target that can be tolerated before excessive voltage and current levels are generated.

In the example, the maximum peak ESD voltage that may be tolerated can be calculated as follows for a positive polarity RFGND2 to GND discharge event where there is no primary protection between the RF domain section 108 and the DC domain section 110. When transient voltage with peak level, $V_{ESD}$, is applied to RFGND2 this transient voltage is coupled by the mosfet device capacitances of the shunt2 element transistor stack 133 to the RF2 node, through the mosfet device capacitances of series2 element transistor stack 131 to the antenna node ANT, through the mosfet device capacitances of the series1 element transistor stack 131 to the RF1 node and through the mosfet device capacitances of the shunt1 element transistor stack 133 to the RFGND1 node. Since there is no primary ESD protection element between the RF domain section 108 and the DC domain section 110 there is no clamping of voltages in the RF domain section 108. Neglecting losses, the transient voltage level that couples onto the RF2, ANT, RF1 and RFGND1 nodes reaches the peak level of $V_{ESD}$. Furthermore, the gate and body terminals of transistors 131, 133 in the stack also reaches peak level of $V_{ESD}$.

Figure 11:
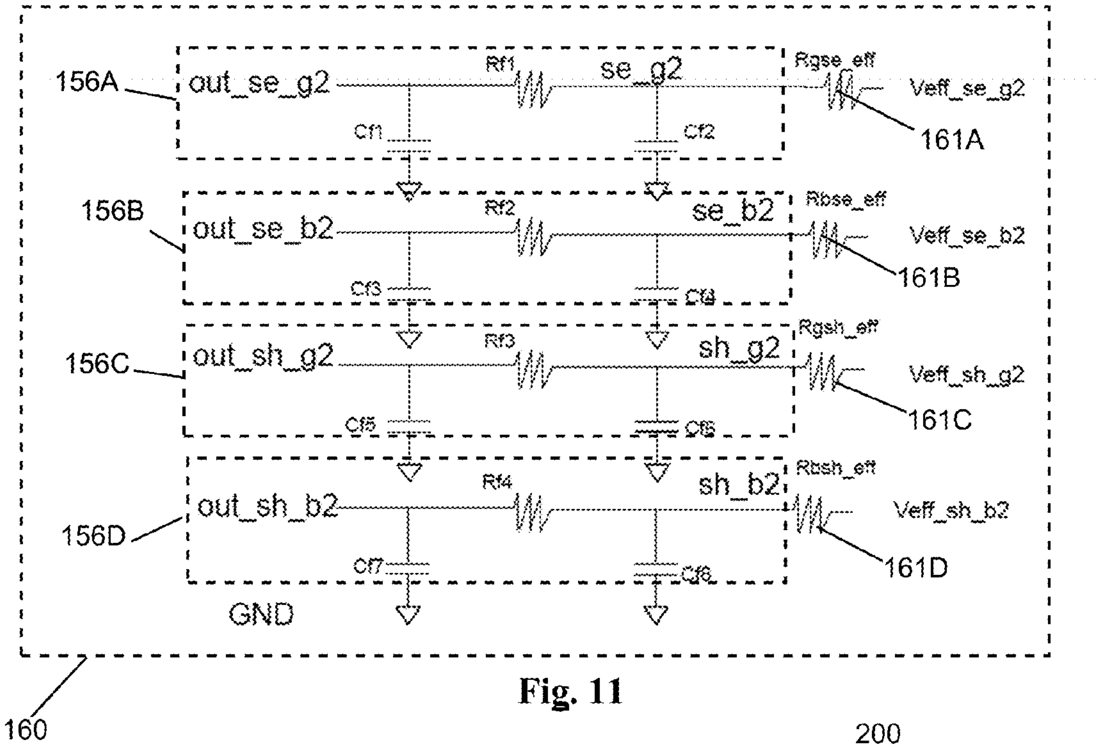
FIG. 11 is an equivalent circuit of RF isolation filters of FIG. 8.

Referring now to FIG. 11 which illustrates an equivalent circuit 160 of the interface between the DC domain section 110 and the RF domain section 108. The equivalent circuit 160 may be used to show the discharge of transient voltage at the gate and body terminals of the transistors 131, 133 of FIG. 4 through the RF isolation filters 129. The circuit 160 is substantially similar to the circuit of FIG. 8 and like components are indicated by similar reference numerals. An additional resistor element 161 is provided on each filter segment 156 which represents the effective resistance connecting to the gate and body terminals of the transistor elements 131, 133 in the RF switch core 123 of FIG. 2. Considering the shunt2 switch element of FIG. 10 where there is stack of 12 transistors:

$$Rgsh\_eff=Rgsh/12 \quad \text{Equation (1)}$$

$$Rbsh\_eff=Rbsh/12. \quad \text{Equation (2)}$$

Where:

Rgsh_eff is the effective value of the resistances connected to the shunt element transistor gate terminals combined in parallel.

Rgsh is the resistance connected to the gate terminal of one transistor in shunt element.

Rbsh_eff is the effective value of resistances connected to the shunt element transistor body terminals combined in parallel.

Rbsh is the resistance connected to the body terminal of one transistor in shunt element.

The effective voltage of the switch element transistor gates, Veff_sh_g 2, may be discharged by a current flowing through Rgsh_eff to sh_g2, from sh_g2 through Rf3 to out_sh_g2 in the RF solation filters 129, from out_sh_g2 through the drain to Nwell parasitic diodes of MP3, MP1 in the level-shifting switch driver 122 to the vdd**2*p*5 node (FIG. 7). Once the current has found a path to the regulated vdd2*p*5 node, a path must be found from there to GND through the drain to Nwell parasitic diodes of MP8 and MP7 to VDD in the regulator output stage (FIG. 5) and from there through the primary ESD power clamp, ESD3 , in the DC domain section 110, (FIG. 10**).

Similarly, the effective voltage of the switch element transistor body terminals, Veff_sh_b2, must be discharged by a current flowing through Rbsh_eff to sh_b2, (FIG. 11), from sh_b2 through Rf4 to out_sh_b2 in the RF isolation filters 129, (FIG. 8), from out_sh_b2 through drain to Nwell parasitic diodes of MP5 in the level-shifting switch driver to GND, (FIG. 7). The drain to Nwell parasitic diode of the device MP5 in the switch driver 122 clamps the voltage level at out_sh_b2 with respect to GND at a much lower voltage level than out_sh_g2 which is clamped through the series connection of four drain to nwell MOSFET parasitic diodes (MP3, MP1, MP8, MP7) plus the ESD power clamp (ESD3).

In this example, the maximum safe peak ESD level may therefore be determined by analysis of the voltage levels generated through the discharge of the effective gate voltage (Veff_sh_g2) using typical values for a CMOS process with 2.5V devices. The following calculations assume that the cut-off frequency of the low pass filters formed by Rgsh_eff, Cf6 and Rf3, Cf5 are too high with respect to the duration of an ESD discharge for significant current discharge to occur through Cf5 and Cf6 which is generally the case for filters designed to provide isolation of RF signals in 100's MHz-GHz range. The RF isolation filter resistors Rf1, Rf2, Rf3, and Rf4 are 10 kΩ. The shunt transistor stack gate resistor Rgsh is 240 kΩ giving Rgsh_eff=Rgsh/12=20 kΩ. The Mosfet drain to source breakdown voltage is >3.8V, Mosfet oxide breakdown voltage=13V. Drain to Nwell forward diode voltage Vd=0.7V. The maximum safe voltage level on vdd**2*p*5** is determined by the drain to source breakdown voltage of switch core transistors, i.e.

$$V(vdd2p5)max=3.8V. \quad \text{Equation (3)}$$

Since there is no direct clamping of voltage at the internally regulated supply the maximum voltage limit is set only by the current that is drawn when the supply of 2.5V to the switch core 123 is raised above its normal level to 3.8V, given the low current consumption requirements of an RF switch an upper estimate of current at elevated internal supply of 1 mA is reasonable. The maximum safe voltage at the switch driver output is in the exemplary arrangement is:

$$V(out\_sh\_g2)max = V(vdd2p5)max+2*Vd \text{ i.e. } V(out\_sh\_g2) max=3.8V+2*(0.7V)=5.2V \quad \text{Equation (4)}$$

Where:

V(out_sh_g2)max is the maximum safe voltage at the switch driver output controlling the shunt2 gate transistor gate terminals.

V(vdd**2*p*5**)max is the maximum safe supply voltage level for the switch core devices.

Vd is a forward voltage of a drain to Nwell diode of a PMOS transistor.

The Maximum safe voltage level at the gate terminal of the switch transistors 131, 133 can be determined from:

$$V(V\mathit{eff\_sh\_g}2)\max = V(\mathit{sh\_g}2)\max + (\mathit{Rgsh\_eff}/\mathit{Rf}3)*(V(\mathit{sh\_g}2)\max - V(\mathrm{out\_}\mathit{sh\_g}2)\max)\text{ i.e. } V(\mathrm{Veff\_sh\_g2})\max = 5.2V + (20\ k\Omega + 10\ k\Omega)*1\ mA = 35.2V. \quad \text{Equation (5)}$$

Where:

V(Veff_sh_g2)max is the maximum effective safe voltage at the shunt2 element transistor gate terminals, equivalent to the voltage at the gate terminal of a transistor at the mid-point in shunt element stack.

V(sh_g2)max is the maximum safe voltage level at the RF output of filter on the signal controlling the shunt2 transistor gate terminals.

Rgsh_eff is the effective value of resistances connected to the shunt2 element transistor gate terminals combined in parallel.

V(out_sh_g2 )max is the maximum safe voltage at the switch driver output controlling the shunt2 gate transistor gate terminals.

The peak ESD voltage, in this example, that may safely be tolerated is therefore, $V_{ESD}$=35.2V. This is well below industry standard target for HBM of 1-2 kV. A similar calculation can be made for a negative polarity event where discharge of Veff_sh_g instead occurs through NMOS devices MN3 and MN1 in the level-shifting switch driver 122.

Figure 12A:
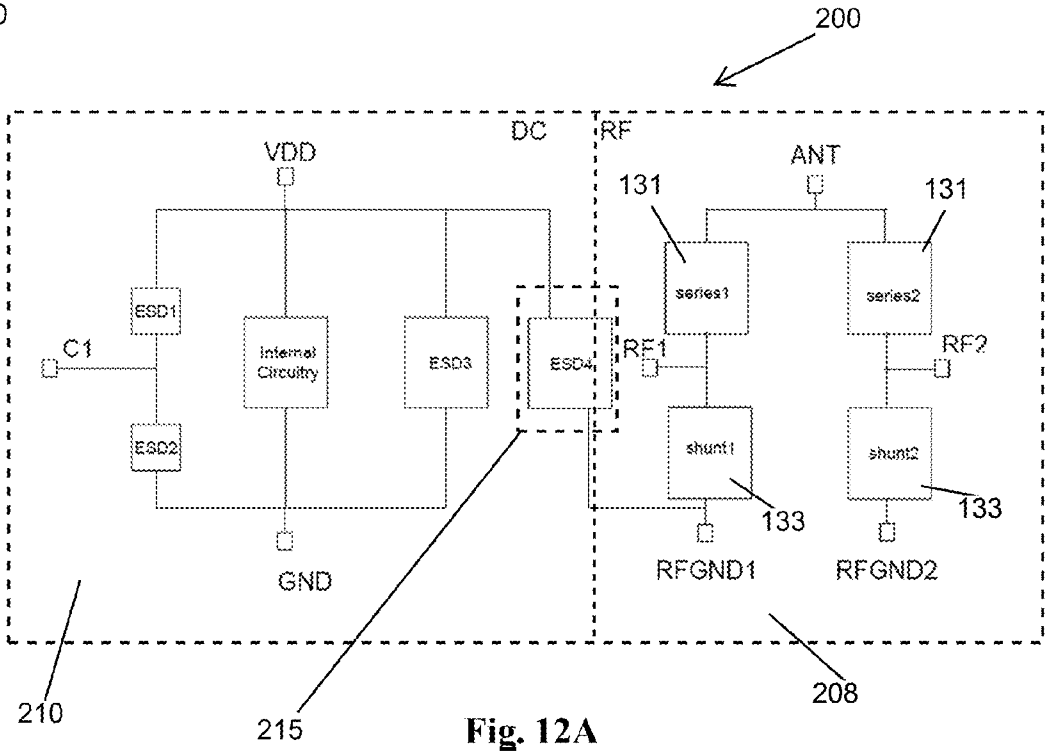
FIG. 12A is a block diagram of an RF switch in accordance with the present teaching.

Referring now to FIG. 12A there is provided an RF switch 200 with inter-domain ESD protection between a DC domain section 210 and an RF domain section 208 in accordance with the present teaching. The RF switch 200 includes similar circuits elements as previously described with reference to the RF switch 100, and like components are indicated by the same reference numerals. The present teaching addresses the drawbacks of the traditional approach by including a power clamp, ESD4, in an interface section 215 operably coupled between the DC domain section 210 and the RF domain section 208. In the exemplary arrangement, ESD4 is provided between the power supply pin, VDD, in the DC domain section 210 and one of the RFGND pins in the RF domain section 208. In the example, ESD4 is connected to RFGND1. However, a person of ordinary skill in the art would readily understand that ESD4 may alternatively be connected to RFGND2. ESD4 provides a direct discharge path for current for inter-domain ESD events.

Figure 12B:
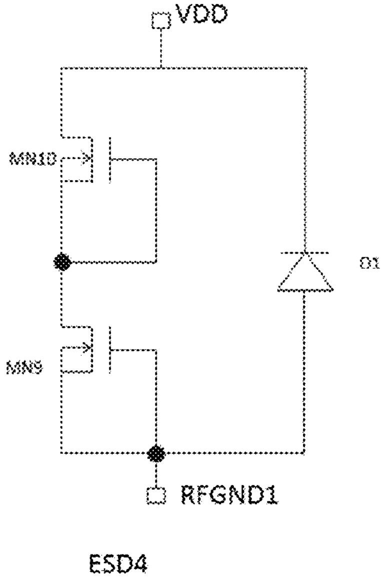
FIG. 12B is circuit schematic of a detail of the RF switch of FIG. 12A.

An exemplary circuit schematic for ESD4 is illustrated in FIG. 12B which includes a pair of NMOS transistors MN9 and MN10 stacked between the VDD node of the DC domain section 210 and the RFGND1 node of the RF domain section 208. The source, gate and body terminals of MN9 are connected to the RFGND1 node. The source, gate and body terminals of MN10 are connected to the drain terminal of MN9. The drain terminal of MN10 is connected to the VDD node. A reversed biased diode D1 is also operably coupled between the VDD node of the DC domain section 210 and the RFGND1 node of the RF domain section 208. Thus the diode D1 is in a parallel configuration with the stacked transistors MN9 and MN10 providing bidirectional operation. In operation, during a positive polarity ESD event a discharge conduction path is provided through parasitic lateral bipolar junction transistors (BJTs) of the NMOS transistors MN9 and MN10. During a negative polarity ESD event the diode D1 provides a discharge conduction path.

The worst case ESD event for the circuit arrangement of 12 A is when the electrostatic discharge occurs between RFGND2 and GND. In this case, the discharge path is from RFGND2 through shunt2, series2, series1, shunt1, ESD4 and ESD3 to GND. The additional power clamp, ESD4, addresses the need to provide a low impedance path for the current to discharge through but the large number of elements that form the current discharge path for the worst case event results in a large build-up of voltage during the ESD event. This voltage build-up does not present a problem to the elements in the direct path themselves because the voltage is divided across the individual devices within each element of the discharge path so that no device is exposed to excessive voltage. While the electrostatic discharge event has been described between the RFGND2 pin in the RF domain section and the GND pin in the DC domain section, it will be appreciated by those of ordinary skill in the art that an inter-domain ESD event could occur between other pins in the DC domain section and the RF domain section. It is not the intention to limit the present teaching to particular pin combinations between the RF-DC domains. The additional power clamp ESD4 will provide a discharge path for any inter-domain ESD event.

Figure 13A:
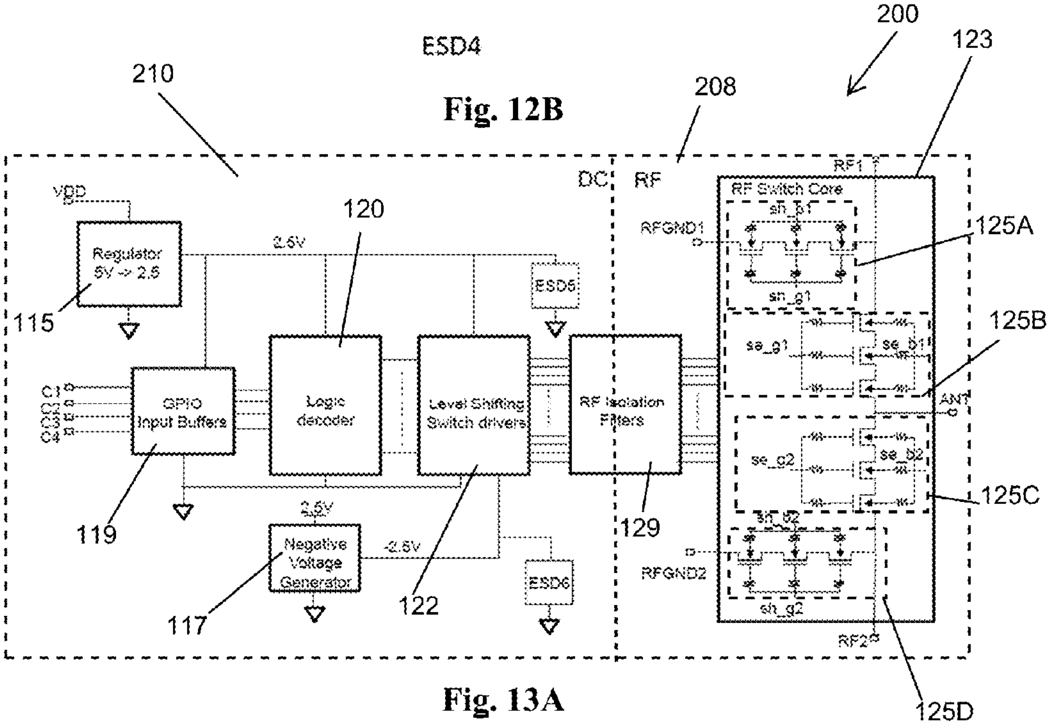
FIG. 13A is a block diagram of the RF switch in accordance with the present teaching.

Additionally the present inventors have realised that it was advantageous to provide secondary ESD protection circuitry in the DC domain section 210 to protect devices on the DC-RF domain interface section that would otherwise be exposed to damaging voltage levels through the RF isolation filters 129 and the level shifting switch drivers 122. The secondary protection clamp elements, ESD5 and ESD6 are shown in FIG. 13A. These protection clamps are termed secondary protection as their function is to limit voltage at the nodes without having to conduct the main high energy current of an ESD event.

Figure 13B:
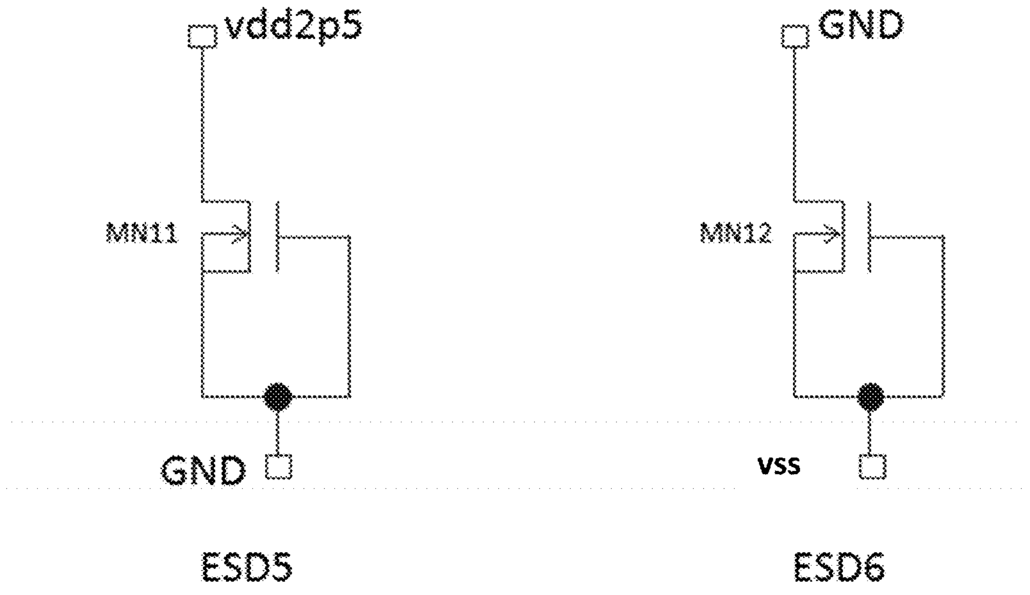
FIG. 13B is a circuit schematic of a detail of the RF switch of FIG. 13A.

A circuit schematic of an exemplary ESD5 and ESD6 is illustrated in FIG. 13B. ESD5 is an NMOS transistor MN11 operably coupled between the node vdd2*p*5 of the 5V-2.5V regulator 115 and a ground node GND. The gate, source and body of MN11 is tied to the ground node GND, while the drain of MN11 is coupled to the node vdd2*p*5. ESD6 is an NMOS transistor MN12 operably coupled between the node vss of the negative voltage generator 117 and the ground node. The gate, source and body of MN12 is tied to the vss node, while the drain of MN12 is coupled to the ground node GND. In operation, during a positive polarity ESD event a discharge conduction path is provided through the parasitic lateral BJTs of MN11 and MN12. During a negative polarity ESD event the body-drain parasitic diodes of MN11 and MN12 provide a discharge conduction path. It will be appreciated by those of ordinary skill in the art that alternative circuit elements could be used instead of those described above for ESD4, ESD5 and ESD6 which are provided by way of example only. For example, an RC-triggered NMOS device, silicon controlled rectifiers or diodes could be used to provide the primary and secondary ESD protection elements.

By way of example the maximum peak ESD voltage that may be tolerated is re-calculated as follows for a positive polarity RFGND2 to GND discharge event on the circuit of FIG. 12A. When transient voltage with a peak level, $V_{ESD}$, is applied to RFGND2 this transient voltage is coupled by the mosfet device capacitances of the shunt2 element transistor stack to the RF2 node, through the mosfet device capacitances of the series2 element transistor stack 131 to the antenna node ANT, through the mosfet device capacitances of the series 1 element transistor stack 131 to the RF1 node, through the mosfet device capacitances of the shunt 1 element transistor stack 133 to the RFGND1 node, through the inter-domain ESD4 power clamp to VDD and through the DC power clamp, ESD3, to GND. Taking the following parameters for CMOS technology with 2.5V core devices as illustrative:

The switch transistor holding voltage once the parasitic BJT operation has been triggered in the exemplary arrangement, Vhld=3.5V.

ESD4 negative polarity clamp voltage V(ESD4−)=1V

ESD3 positive polarity clamp voltage, V(ESD3+)=9V

The peak voltages at each node for a 2 kV ESD event may be calculated for an exemplary arrangement where there are twelve transistors in the shunt stack and thirteen transistors in the series stack:

$$V(shunt2)=V(shunt1)=12*Vhld=42V. \quad \text{Equation (6)}$$

$$V(series2)=V(series1)=13*Vhld=45.5V. \quad \text{Equation (7)}$$

Where:

Vhld is the holding voltage at which the transistor drain to source voltage stabilises once the parasitic lateral BJT turns on.

V(shunt2) is the holding voltage built up through stack of transistors in shunt2 element.

V(shunt1) is the holding voltage built up through stack of transistors in shunt1 element.

V(series2) is the holding voltage built up through stack of transistors in series2 element.

V(series1) is the holding voltage built up through stack of transistors in series1 element.

V(ESD4−) is the clamping voltage of the ESD4 protection element for negative polarity event at ESD4.

V(ESD3+) is the clamping voltage of the ESD3 protection element for positive polarity ESD event at ESD3.

Given the parameters above, the peak voltage at the nodes on the primary discharge path during an ESD event are VDD=9V, RFGND1=10V, RF1=52V, ANT=97.5V, RF2=143V and RFGND2=185V. The effective Gate and body voltage reached by transistors in shunt2 is:

$$V(Veff\_sh\_g2)=V(Veff\_sh\_b2)=(V(RF2)+V(RFGND2))/2=164V.$$

Where:

V(RF2) is the voltage built up at the RF2 node that is equal to the sum of voltages built up through ESD3, ESD4, shunt1, series1 and series2 elements.

V(RFGND2) is the voltage built up at the RFGND2 node equal to the sum of voltages built up through ESD3, ESD4, shunt1, series1, series2 and shunt2 elements.

V(Veff_sh_g2) is the effective voltage at the shunt2 element transistor gate terminals, equivalent to the voltage at the gate terminal of a transistor at a mid-point in shunt element stack.

V(Veff_sh_b2) is the effective voltage at the shunt2 element transistor body terminals, equivalent to the voltage at the body terminal of a transistor at a mid-point in the shunt element stack.

Taking the equivalent circuit model showing the discharge of transient voltage at the gate and body terminals through the RF isolation filters 129 into the DC domain section 110 and using the same values for resistors as before requires a peak current of:

$$I(sh\_g2)=I(sh\_b2)=164V/30\ k\Omega=5.467\ mA \quad \text{Equation (9)}$$

to be discharged, where:

I(sh_g2) is the peak current flowing through the shunt2 gate filter network to the DC domain section 210.

I(sh_b2) is the peak current flowing through the shunt2 body filter network to the DC domain section 210.

The secondary ESD protection clamp ESD5 is sized such that the voltage at the node vdd2p5 is clamped at less than or equal to 3.8V when a current of 5.467 mA is discharged to achieve 2 kV HBM protection. The addition of the primary and secondary ESD protection clamps and sizing in conjunction with the RF isolation filter values results in a safe peak ESD voltage that may be tolerated on the inter-domain ESD event being increased from 35.2V to 2000V.

Figure 14A:
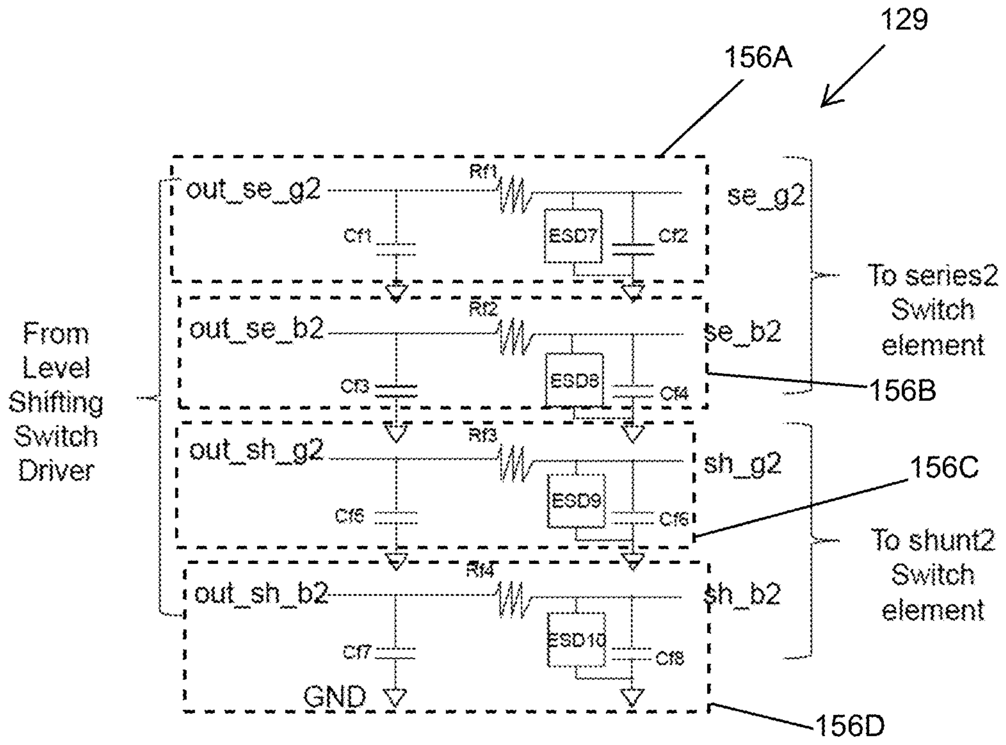
FIG. 14A is a circuit schematic of a detail of an RF switch in accordance with the present teaching.
Figure 14B:
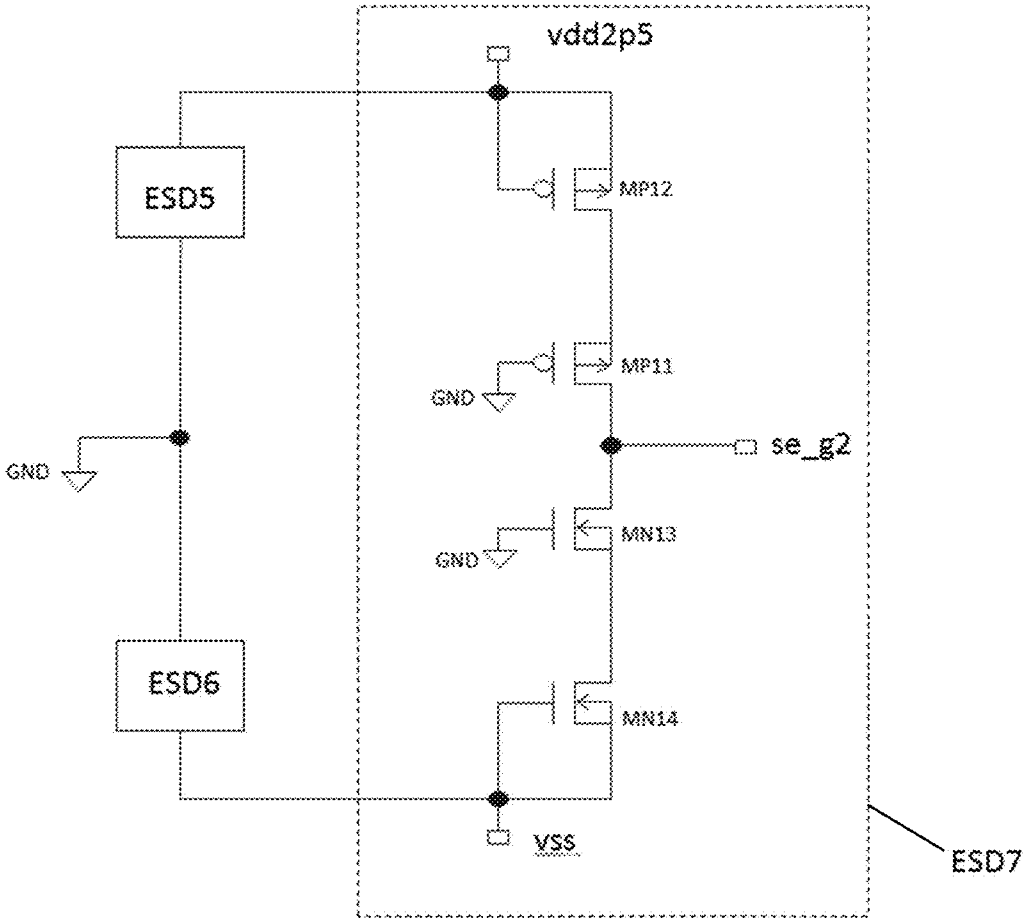
FIG. 14B is a circuit schematic of a detail of FIG. 14A.

The capacitors in the RF isolation filters are often formed by MOSFET gate oxide which provides large capacitance per unit area. As a consequence, the maximum safe voltage level across the capacitors at the RF interface in the isolation filters Cf6, V(sh_g2)max=13V. The additional requirement of keeping the maximum voltage levels at the RF interface of the isolation filters below the safe level for the gate oxide requires either adding design constraint in relative scaling of resistors in the filter and those connecting to the gate and body terminals of the transistors in the switch elements or the addition of secondary clamping elements in the RF isolation filter. The additional clamp elements ESD7-ESD10 of the RF isolation filter 229 are illustrated in FIG. 14A. A circuit schematic of ESD7 is shown in detail in FIG. 14B. ESD7 comprises transistors MP11, MP12, MN13 and MN14 which are stacked between the vdd2p5 node and the vss node. The transistors MP11, MP12, MN13 and MN14 operate in conjunction with ESD5 and ESD6. For a positive polarity ESD event, the conduction path from the node se_g2 to GND is through the nwell to drain diodes of MP11 and MP12 to vdd2p5 and then through ESD5 to GND. For a negative polarity ESD event, the conduction path from node se_g2 to GND is through the body to drain diodes of MN13 and MN14 to vss and then through ESD6 to GND. Transistors MP12 and MN14 are arranged with gate terminal connected to source terminal so that transistors are in an off state and do not conduct current during normal operation of the RF switch 200. For brevity, ESD7 has only been described, however, ESD8-ESD10 are equivalent to ESD7.

Considering the same illustrative example as above with the additional requirement that the gate oxide voltage be kept below 13V, V(sh_g_2)max=13V. This may be achieved by resistor scaling. In the exemplary arrangement:

$$V(sh\_g2)max=V(out\_sh\_g2)+(V(Veff\_sh\_g2)max-V(out\_sh\_g2))*Rf3/(Rf3+Rgsh\_eff) \quad \text{Equation (10)}$$

Where:

V(sh_g2)max is the maximum safe voltage level at the RF output of the filter on the signal controlling the shunt2 transistor gate terminals.

V(out_sh_g2) is the maximum safe voltage at the switch driver output controlling the shunt2 gate transistor gate terminals.

V(Veff_sh_g2)max is the effective voltage at the shunt2 element transistor gate terminals, equivalent to the voltage level at the gate terminal of a transistor at a mid-point in shunt element stack.

Rgsh_eff is the effective value of the resistances connected to the shunt2 element transistor gate terminals combined in parallel.

For example. if Rf3 is maintained at 10 kΩ, then Rgsh_eff must be set to be at least 211 kΩ so that: 13V<=5.2V+(177.2V−5.2V)*10 kΩ/221 kΩ.

In the general scenario where voltages are limited at two nodes on the discharge path for current the principle of resistor scaling can be applied to limit the voltage level at an intermediate point on the discharge path to a safe level. If the levels at which voltages are limited at both ends of the discharge path are known and the safe level for the intermediate point on the discharge path is known to fall within these limits then the resistance values between both ends and the intermediate point may be scaled to maintain the intermediate points within its safe level. Equation 10 may be rearranged to express the resistor scaling for the network connected to the shunt2 element transistor gate terminals.

$$(Rf3+Rgsh\_eff)/Rf3=(V(Veff\_sh\_g2)max-V(out\_sh\_g2))/(V(sh\_g2)max-V(out\_sh\_g2)) \quad \text{Equation (11)}$$

An alternative to resistor scaling is the placement of additional clamp elements ESD7-ESD10 directly on the node connected to the gate oxide capacitors in the RF isolation filters 129 as illustrated in FIG. 14A. The clamp elements ESD7-ESD10 are similar in structure to the output stage of switch driver 122, providing clamping via vdd2*p*5 or vss internal nodes, but other structures can also fulfil same function. For example, in FIG. 14A, where the clamp element on sh_g2, ESD9, is similar to the switch driver output, then sh_g2 is now clamped at 5.2V. In this case Veff_sh_g2 is mostly discharged through Rgsh_eff and the ESD9 clamp element. Peak current is discharged through ESD9, using the original value of Rgsh_eff=20 kΩ is now I(ESD9)max=164V/20 kΩ=8.2 mA. The clamp element and the discharge paths must be sized accordingly to conduct this level while restricting voltage to the required safe levels.

It will be appreciated by those skilled in the art that the series and shunt transistor stacks 131, 133 are designed to evenly divide the voltage between two nodes across the stack so that no individual transistor is exposed to voltage difference between any two terminals in transistor that may be large enough to cause damage. This is a requirement both for normal operation and during an ESD event. Referring again to FIG. 4, when there is a positive ESD discharge between RFGND2 and GND, initial transient voltage levels were previously calculated as 185V on RFGND2 and 143V on RF2. The initial transient voltage difference between RFGND2 and RF2 is evenly divided across the transistors in the shunt stack, so that the source-drain voltage, Vsd, of each transistor is limited to the transistor holding voltage 3.5V once the parasitic BJT operation has been triggered. Initial transient source to drain voltage is evenly divided between source to gate and gate to drain capacitance so that Vsg=Vgd=Vsd/2=1.75V. Body to source and body to diode parasitic diode in each transistor results in an unequal division of the initial transient source to drain voltage between source to body and body to drain capacitance due to clamping so that Vsb≠Vbd.

Assuming Vdiode=0.7V, $Vsb=2.8V$ and $Vbd=0.7V$.

Voltage that is developed across the gate oxide is the difference between voltage of the gate and body terminal of the transistor. Initially the oxide voltage is given by equation 11:

$$Vgb=1.05V, \quad \text{Equation (12)}$$

which is well below the safe oxide voltage level of 13V. The maximum level that the oxide voltage can experience during an ESD event discharge depends on the duration of the ESD event and the relative time constant of the capacitance-resistor (C-R) coupling networks from the source and drain to the gate. The clamping action of the body parasitic diode of the Mosfet transistor means that the initial voltage on the body is clamped to 0.7V above the drain voltage indefinitely. Thus, the gate voltage will discharge from its initial transient level at a rate governed by network time constant. In the exemplary arrangement:

$$\tau=Rgsh\_eff*Cgate, \quad \text{Equation (13)}$$

Where:

τ is the RC time constant of the coupling network on the transistor gate terminal.

Rgsh_eff is the effective value of resistances connected to the shunt2 element transistor gate terminals combined in parallel.

Cgate is total MOSFET gate oxide capacitance, i.e. sum of gate to source and gate to drain capacitances.

The absolute value of the initial transient voltage on RFGND2 is 185V, therefore the initial transient voltage of the gate terminal on the transistor closest to RFGND2 is 185V−1.75V=183.25V. This initial transient voltage only has to decay by 11.95V for the voltages across the oxide, either between the gate and drain or the gate and body terminals to exceed the safe level of 13V. This corresponds to a decay of approximately 5% from its initial transient level which will occur within approximately 0.05τ.

Figure 15:
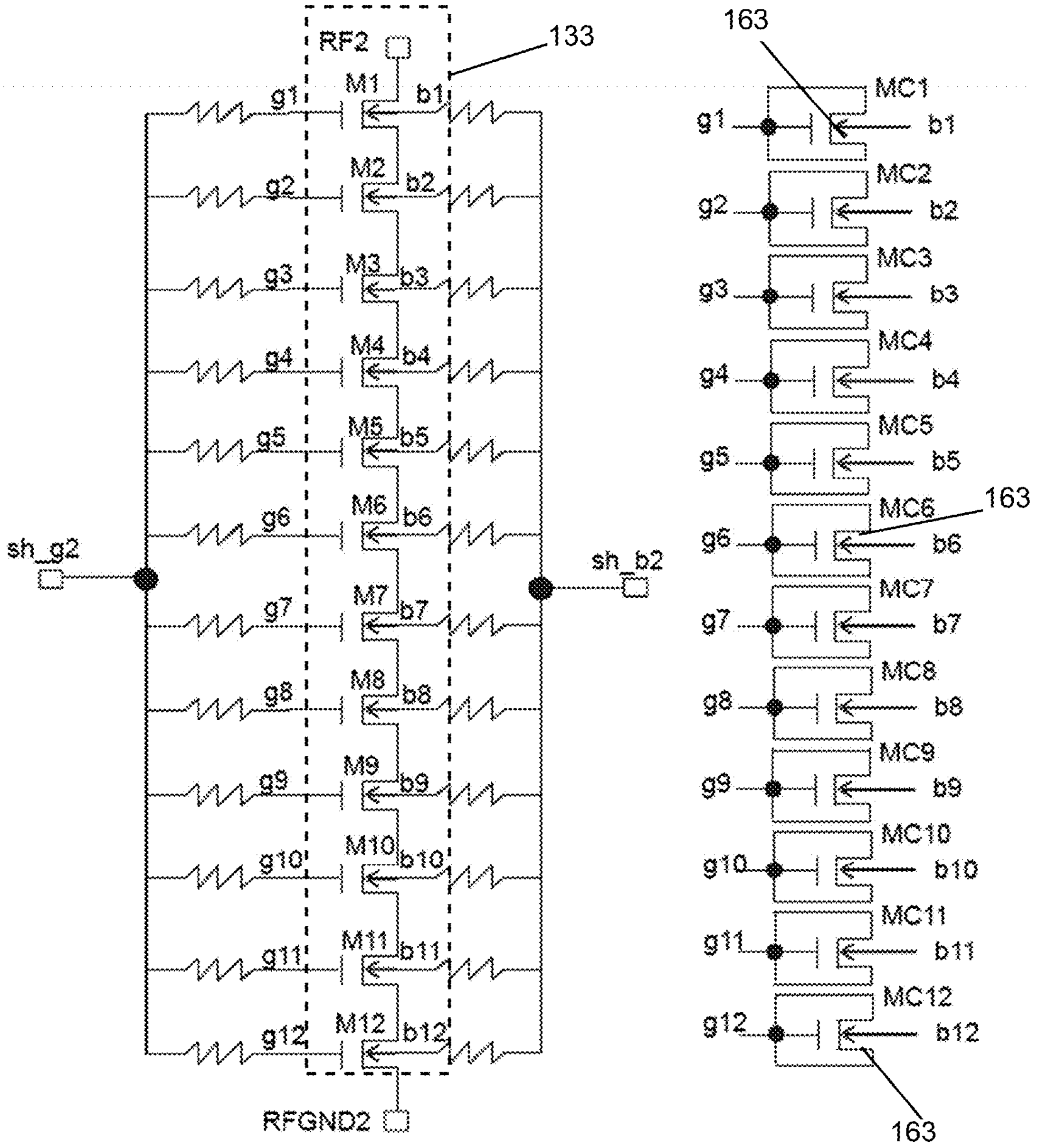
FIG. 15 is a schematic circuit diagram of a detail of an RF switch in accordance with the present teaching.

The gate network time constant must be sufficient so that decay of the voltage on the gate from its initial peak value within the duration of the ESD event is not sufficient to exceed the safe level for the oxide. To remove dependence on the gate network time constant an additional clamping element, for example, a MOSFET transistor 163 may be added between the body and gate of the shunt transistors 133 and the series transistors 131 in the switch core 123 as illustrated in FIG. 15. The Mosfet transistor 163 may be small relative to the main switch transistors 131, 133 because it remains off and does not conduct current during normal operation and is required to conduct very low current levels during an ESD event. Clamping transistor devices MC1-MC12 are connected to provide clamping between gate, g1-g12, and body, b1-b12, nodes of the main transistors M1-M12. Each transistor in the stack has an associated gate resistor and an associated body resistor. In the exemplary arrangement:

$$Width(MCn) \ll Width(Mn).$$

Where:

Width(Mn) is the width of a stack transistor.

Width(MCn) is the width of a clamping transistor.

With this arrangement Vg is clamped at 0.7V above Vb indefinitely.

The calculations described herein are provided for illustration purposes only and it is not the intention to limit the present teaching to these particular examples. It will be appreciated, that the ESD event could be a positive or a negative polarity event. Furthermore, the ESD event could occur between various inter-domain DC-RF pin combinations as would be understood by a person of ordinary skill in the art. The inter-domain pin combinations which are described herein are provided by way of example only to give an understanding of the advantage of providing an RF switch having inter-domain ESD protection. The advantages of the present teaching are many and may be demonstrated using computer simulation using the circuit of FIG. 13A. Simulation plots of a 2 kV HBM discharge between the RF domain section 208 and the DC domain section 210 are provided in FIGS. 16-20. The Joint Electron Devices Engineering Council (JEDEC) have defined a model for HBM that is used in a simulation setup where a 100 pF capacitor, initially charged to 2 kV, is discharged through a 1.5 kΩ resistor between the RFGND2 and GND pins of the RF Switch 200. The simulations of FIGS. 16-20 were realised using this simulation setup.

Figure 16:
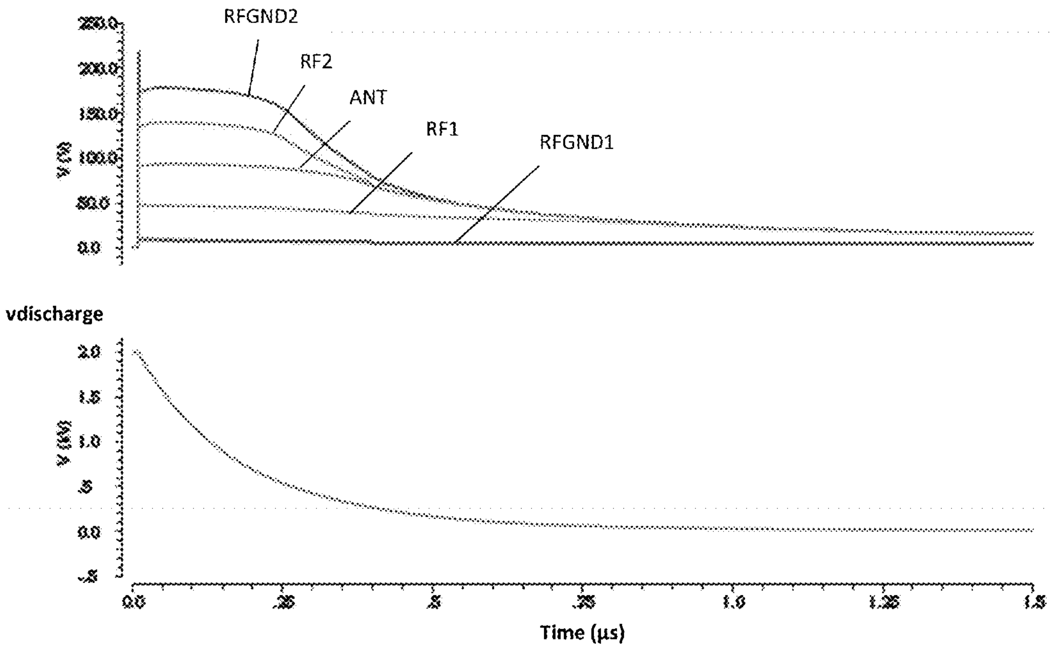
FIG. 16 is a graphical representation from a computer simulation which shows transient voltages that result at nodes in the RF domain section of an RF switch in accordance with the present teaching.

FIG. 16, shows the transient voltages that result at the nodes in the RF domain section 208 when the HBM event model capacitor charged to 2 kV is discharged between the most distant ground pin in the RF domain section 208, RFGND2 and the ground pin in DC domain section 210, GND. As illustrated in the upper plot of FIG. 16 the peak voltages are similar to the calculated values in description above. The peak voltage level reached at the RFGND2 pin during the ESD event is 178V and does not approach the 2 kV level applied by the capacitor. The voltages at the other pins RF2, ANT, RF1 and RFGND1 are also within the safe level. The lower plot shows the profile of the voltage being discharged from the capacitor between RFGND2 and the ground pin in DC domain section 210, GND. The voltage build up across the RF switch elements is limited as described by Equations 6 and 7 above. Consequently, the voltage levels at all the points on the gate and body discharge networks to the DC domain section 210 are limited to a much lower value than would occur if ESD4 was not operably coupled between the RF domain section 208 and the DC domain section 210. This allows the RF switch 200 to tolerate a 2 kV HBM ESD event between the RF and DC domain pins without damage occurring.

Figure 17:
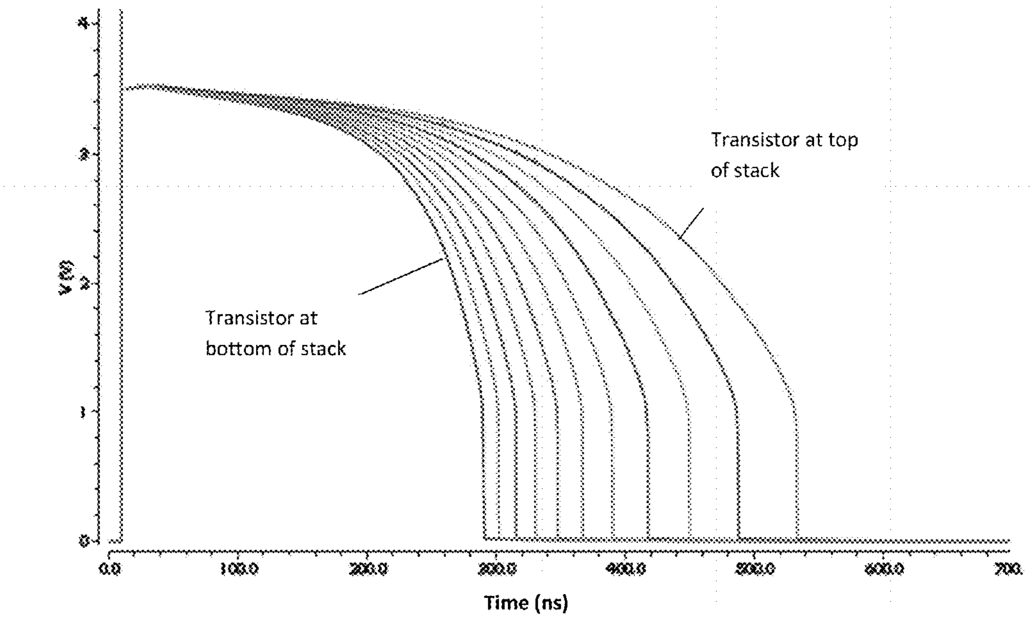
FIG. 17 is a graphical representation from a computer simulation which shows the division of transient voltage during an ESD event through the transistor stack in a shunt switch element of an RF switch in accordance with the present teaching.

FIG. 17 shows the division of the transient voltage during an ESD event through the transistor stack 133 in the shunt switch element. As illustrated the clamping voltage across each transistor is at safe level of approximately 3.5V. The voltage build up across the RF switch shunt element transistors is limited as described by Equation 6. The development of this holding voltage level across each transistor indicates that the primary ESD discharge current is flowing through these stack transistors 133. In providing a primary ESD discharge path between the RF and DC domains through the clamping element ESD4, the necessity for large ESD discharge current levels to flow through the core circuitry is removed. This allows the RF switch 200 to tolerate a 2 kV HBM ESD event between the RF and DC domain pins without damage occurring.

Figure 18:
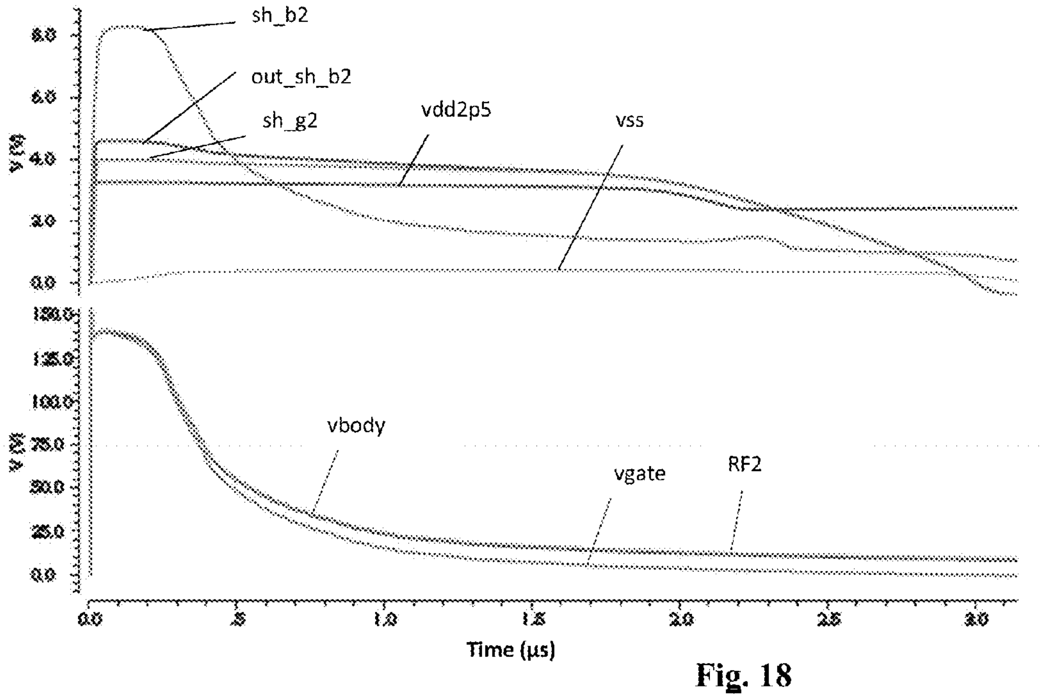
FIG. 18 is a graphical representation from a computer simulation which shows voltages at a switch driver and RF isolation filters remaining at safe levels in the upper plot; and the lower plot shows absolute voltage levels on the gate and body nodes of a transistor in the series stack tracking the voltage excursion at an RF node.

The upper plot of FIG. 18 shows voltages at the nodes of the switch driver 122 and the RF isolation filters 129 remaining at safe levels. The lower plot of FIG. 18 illustrates the absolute voltage levels on the gate and body nodes of the transistors in the series stack tracking the voltage excursion at the RF node. The maximum voltage level observed at RF isolation filter output node, sh_b2, is 8.2V which is well below the 13V safe level for a gate oxide capacitor. The maximum voltage level observed at the driver output node, out_sh_g2, is 4.6V, which is below the safe level defined in Equation 4. This plot indicates how the large voltage level of a 2 kV discharge event at the pins is transformed to safe level within the core circuitry by the inclusion of primary and secondary ESD protection circuitry ESD4, ESD5 and ESD6 for an ESD discharge event between the RF domain section 208 and the DC domain section 210.

Figure 19:
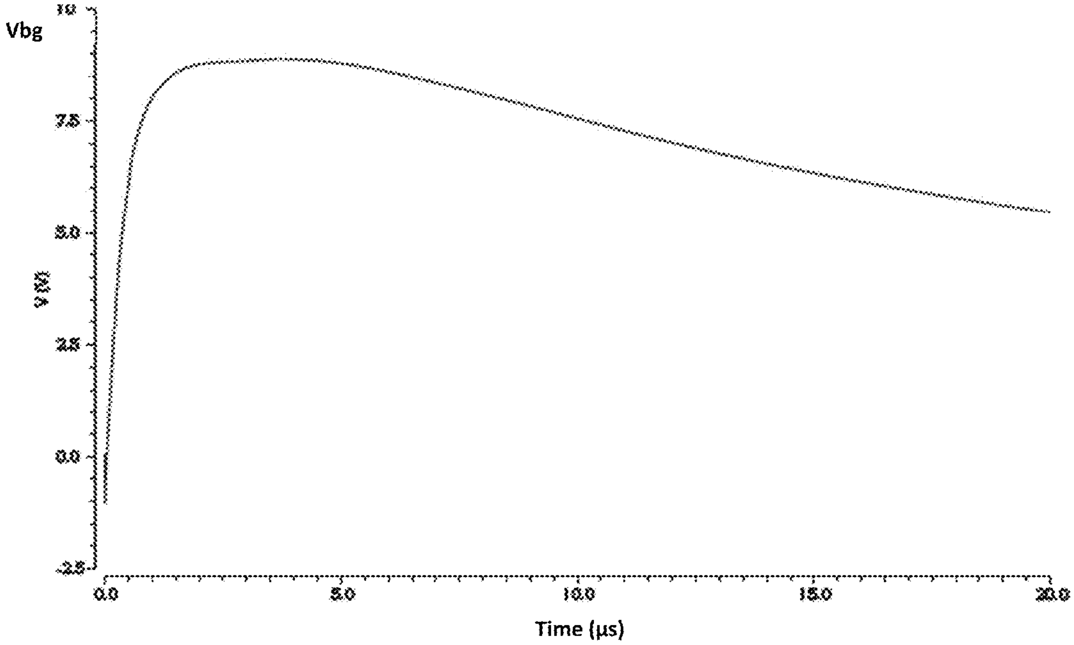
FIG. 19 is a graphical representation from a computer simulation which shows voltage across oxide, gate to body voltage, of a transistor in the shunt stack furthest from an applied ESD zap being maintained below a safe level of 13V.

FIG. 19 shows the voltage across the oxide, gate to body voltage, of a transistor in the shunt stack 133 furthest from the applied ESD zap being maintained below safe level of 13V. The initial body to gate voltage across the transistor oxide is −1V, due to the clamping effect of the body to drain parasitic diode, see Equation 11. The body to gate voltage increases as the voltage level on the gate terminal decreases with the time constant described by Equation 12. The RC elements in this case are sized such that the maximum value of the gate to body voltage of 8.9V is within the safe level for the gate oxide. The RC time constant required is made feasible to implement by limiting the absolute voltage reached at the pins and thereby at the gate terminals as illustrated in previous figures.

Figure 20:
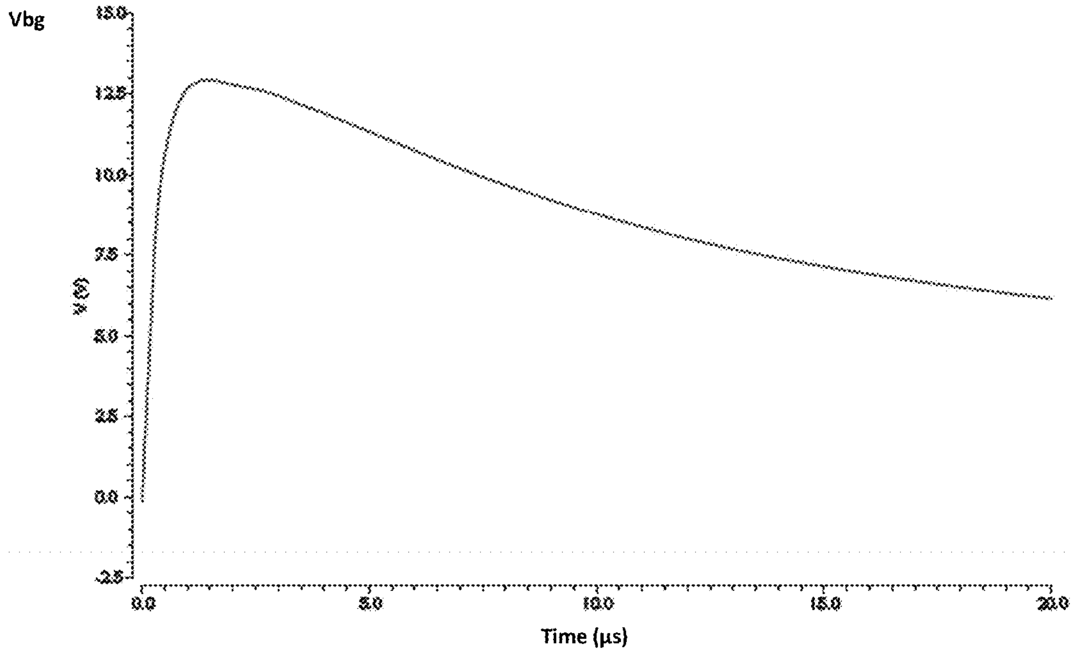
FIG. 20 is a graphical representation from a computer simulation which shows voltage across oxide, gate to body voltage, of a transistor in the shunt stack closest to an applied ESD zap being maintained below a safe level of 13V.

FIG. 20 illustrates the voltage across the oxide, gate to body voltage, of a transistor 133 in the shunt stack closest to the applied ESD zap being maintained below the safe level of 13V. In this case the maximum gate to body voltage reached is 12.9V, which is still within safe level for gate oxide. The maximum gate to body voltage is increased in this case compared to FIG. 19 because the absolute voltage level at the gate terminal of the transistor 133 in the shunt stack closest to the applied ESD zap is higher than that at the gate terminal of the transistor 133 in the shunt stack furthest from the applied ESD zap. FIG. 20 indicates how a large voltage level of a 2 kV discharge event at the pins is transformed to a safe level between the terminals of the transistor in RF switch elements by the inclusion of ESD protection circuitry for the ESD discharge event between the RF domain section 208 and the DC domain section 210.

It will be understood that what has been described herein are exemplary RF switches with inter-domain ESD protection between the DC domain section 210 and the RF domain section 208. It will be understood that the present teaching is also directed to a method of fabricating the RF switch 200. Semiconductor processing techniques are well known in the art and may include for example, but not limited to, deposition, implantation, diffusion, patterning, doping, and etching. Since these semiconductor processing techniques are known in the art, it is not intended to describe them further. A person skilled in the art would understand how to fabricate the RF switch 200 on a substrate using these known techniques. For example, the RF switch 200 may be fabricated on a silicon-on-insulator substrate which was described with reference to FIG. 9. It is envisaged that the DC domain section 210 and the RF domain section may be formed on a single semiconductor die with ESD4 being provided at die level at the interface between the DC domain section 210 and the RF domain section 208. However, it is not intended to limit the RF switch of the present teaching to being provided on a single semiconductor die as alternative fabrication processes are envisaged. While in the exemplary arrangement the switch core 123 has been described to include a stack of series transistors and a stack of shunt transistors. It is envisaged that the switch core could include one or more stack of transistors as desired. The switching elements in the switch core 123 have been described as being transistors. However, the switching elements may include one or more capacitors and/or resistors. For example, the switch core may include a switch capacitor network or a switch resistor network. The DC domain section may comprise one or more digital logic, bias generation, driver, memory, filter, interface, and power management circuitry. While the DC domain section 208 in the exemplary arrangement has been described with reference to a single DC power supply node VDD it is envisaged that two or more DC power supply nodes may be incorporated into the DC section as would be understood by a person of ordinary skill in the art.

The method of fabrication may comprise the steps of providing an RF domain section 208 having a plurality of RF switching elements 105 on a semiconductor substrate. A DC domain section 210 having circuitry configured for driving the RF switching elements 105 may also be provided on the semiconductor substrate. At least one primary ESD protection element (ESD4) is operably coupled between the RF domain section 208 and the DC domain section 210 on the semiconductor substrate. The at least one primary ESD protection element (ESD4) may be operably coupled between a supply voltage node (VDD) in the DC domain section210 and an RF ground reference node (RFGND1) in the RF domain section 208. The method includes providing one or more secondary ESD protection elements (ESD5, ESD6) in the DC domain section 210. Additionally, the method includes coupling one of the secondary ESD protection elements ESD5 to an output node of a voltage regulator 115 in the DC domain section 210. The other one of the secondary ESD protection elements ESD6 is coupled to an output node of a negative voltage generator 117 in the DC domain section 210. The method further includes providing at least one RF isolation filter 129 having an ESD protection element ESD7 on the semiconductor substrate between the DC domain section 210 and the RF domain section 208. The at least one RF isolation filter 129 comprises a pair of capacitors Cf1, Cf2 and a resistor Rf1 operably coupled there between, one of the capacitors Cf1 is associated with the DC domain section 210 and the other capacitor Cf2 is associated with the RF domain section 208. The ESD protection element ESD7 is operably coupled to the resistor terminal RF1 associated with the RF domain section 208. The method further includes providing a stack of series transistors 131 and/or a stack of shunt transistors 133 in the RF domain section 208, and providing respective clamping elements 163 on the semiconductor substrate which are associated with the corresponding transistors 131, 133. Advantageously, the method includes coupling the respective clamping element between a body terminal and a gate terminal of the corresponding transistor 131,133.

While the present teaching has been described with reference to exemplary arrangements and circuits it will be understood that it is not intended to limit the teaching of the present teaching to such arrangements as modifications can be made without departing from the spirit and scope of the present invention. In this way it will be understood that the present teaching is to be limited only insofar as is deemed necessary in the light of the appended claims.

Similarly the words comprises/comprising when used in the specification are used to specify the presence of stated features, integers, steps or components but do not preclude the presence or addition of one or more additional features, integers, steps, components or groups thereof.

We claim:

1. An RF switch integrated circuit with inter-domain ESD protection;

the RF switch comprising:

- an RF domain section having a plurality of RF switching elements;
- a DC domain section having circuitry configured for driving the RF switching elements; and
- at least one primary ESD protection element formed on a semiconductor die containing the RF domain section and the DC domain section; wherein the at least one primary ESD protection element is internally coupled on the semiconductor die between a pin of the RF domain section and a pin of the DC domain section and provides a direct discharge path for inter-domain ESD events occuring between pins associated with the DC domain section and pins associated with the RF domain section.

2. An RF switch as claimed in claim 1, wherein the at least one primary ESD protection element is internally coupled on the semiconductor die between a supply voltage pin in the DC domain section and an RF ground reference pin in the RF domain section.

3. An RF switch as claimed in claim 2, wherein the RF domain section includes one or more RF ground reference pins each associated with a corresponding transistor connecting two RF pins.

4. An RF switch as claimed in claim 1, wherein the DC domain section comprises one or more secondary ESD protection elements.

5. An RF switch as claimed in claim 4, wherein the DC domain section comprises two secondary ESD protection elements.

6. An RF switch as claimed in claim 5, wherein one of the secondary ESD protection elements is operably coupled to an output node of a voltage regulator in the DC domain section.

7. An RF switch as claimed in claim 6, wherein the other one of the secondary ESD protection elements is operably coupled to an output node of a negative voltage generator in the DC domain section.

8. An RF switch as claimed in claim 1, further comprising a plurality of RF isolation filters operably coupled between the DC domain section and the RF domain section, the respective RF isolation filters include resistive loads which are scaled relatively to an effective resistive load that occurs between an output node of the RF isolation filter and a terminal of an RF switch element.

9. An RF switch as claimed in claim 1, further comprising at least one RF isolation filter having an ESD protection element, the at least one RF isolation filter being operably coupled between the DC domain section and the RF domain section.

10. An RF switch as claimed in claim 9, wherein the at least one RF isolation filter comprises a pair of capacitors and a resistor operably coupled there between, one of the capacitors is associated with the DC domain section and the other capacitor is associated with the RF domain section, the ESD protection element is operably coupled to the resistor.

11. An RF switch as claimed in claim 1, wherein the RF domain section comprises at least one stack of transistors, and a clamping element is associated with each transistor.

12. An RF switch as claimed in claim 11, wherein the clamping element is operably coupled between a body terminal and a gate terminal of the corresponding transistor.

13. An RF switch as claimed in claim 12, wherein the clamping element comprises a transistor.

14. An RF switch as claimed in claim 13, wherein the clamping element comprises a MOSFET transistor.

15. An RF switch as claimed in claim 12, wherein the clamping element is turned off during normal operation of the RF switch and is turned on in response to experiencing an ESD event.

16. A semiconductor die having an RF switch integrated circuit with inter-domain ESD protection fabricated thereon, wherein the RF switch integrated circuit comprises:

- an RF domain section having a plurality of RF switching elements;
- a DC domain section having circuitry configured for driving the RF switching elements; and
- at least one primary ESD element formed on a semiconductor die containing the RF domain section and the DC domain section; wherein the at least one primary ESD protection element is internally coupled on the semiconductor die between a pin of the RF domain section and a pin of the DC domain section and provides a direct discharge path for inter-domain ESD events occuring between pins associated with the DC domain section and pins associated with the RF domain section.

17. A semiconductor substrate as claimed in claim 16 comprising a silicon-on-insulator arrangement.

18. A method of fabricating an RF switch integrated circuit having inter-domain ESD protection; the method comprises:

providing an RF domain section having a plurality of RF switching elements on a semiconductor die;

providing a DC domain section having circuitry configured for driving the RF switching elements on the semiconductor die; and forming at least one primary ESD protection element on the semiconductor die containing the RF domain section and the DC domain section; wherein the at least one primary ESD protection element is internally coupled between a pin of the RF domain section and a pin of the DC domain and provides a direct discharge path for inter-domain ESD events occuring between pins associated with the DC domain section and pins associated with the RF domain section.

19. A method as claimed in claim 18, wherein the at least one primary ESD protection element is operably coupled between a supply voltage pin in the DC domain section and an RF ground reference pin in the RF domain section.

20. A method as claimed in claim 18, further comprising: providing one or more secondary ESD protection elements in the DC domain section.

21. A method as claimed in claim 20, further comprising: coupling one of the secondary ESD protection elements to an output node of a voltage regulator in the DC domain section.

22. A method as claimed in claim 21, further comprising: coupling a further secondary ESD protection elements to an output node of a negative voltage generator in the DC domain section.

23. A method as claimed in claim 18, further comprising coupling a plurality of RF isolation filters between the DC domain section and the RF domain section, the respective RF isolation filters include resistive loads which are scaled relatively to an effective resistive load that occurs between an output node of the RF isolation filter and a terminal of an RF switch element.

24. A method as claimed in claim 18, further comprising: providing at least one RF isolation filter having an ESD protection element between the DC domain section and the RF domain section.

25. A method as claimed in claim 24, wherein the at least one RF isolation filter comprises a pair of capacitors and a resistor operably coupled there between, one of the capacitors is associated with the DC domain section and the other capacitor is associated with the RF domain section, the ESD protection element is operably coupled to the resistor.

26. A method as claimed in claim 18, further comprising: providing at least one stack of transistors in the RF domain section, and providing respective clamping elements on the semiconductor substrate which are associated with corresponding transistors.

27. A method as claimed in claim 26, further comprising: coupling the respective clamping element between a body terminal and a gate terminal of the corresponding transistors.

* * * * *